(12) United States Patent
Aoki

(10) Patent No.: US 10,886,484 B2
(45) Date of Patent: Jan. 5, 2021

(54) ORGANIC THIN FILM PHOTOVOLTAIC DEVICE MODULE AND ELECTRONIC APPARATUS

(71) Applicant: ROHM CO., LTD., Kyoto (JP)

(72) Inventor: Yoichi Aoki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/442,360

(22) Filed: Feb. 24, 2017

(65) Prior Publication Data
US 2017/0162810 A1 Jun. 8, 2017

Related U.S. Application Data

(63) Continuation of application No. PCT/JP2015/061331, filed on Apr. 13, 2015.

(30) Foreign Application Priority Data

Aug. 29, 2014 (JP) .................. 2014-176185

(51) Int. Cl.
*H01L 51/44* (2006.01)
*H01L 27/30* (2006.01)
(Continued)

(52) U.S. Cl.
CPC .......... *H01L 51/442* (2013.01); *H01L 27/301* (2013.01); *H01L 51/4253* (2013.01);
(Continued)

(58) Field of Classification Search
CPC ............. H01L 31/0463; H01L 31/0465; H01L 31/0468; H01L 31/046; H01L 51/44–448; H01L 27/301; H01G 9/2081
See application file for complete search history.

(56) References Cited

U.S. PATENT DOCUMENTS 4,532,371 A * 7/1985 Hanak ................... H01L 31/202
136/249
4,724,011 A * 2/1988 Turner ............ H01L 31/022425
136/244
(Continued)

FOREIGN PATENT DOCUMENTS

JP 60-149178 A 8/1985
JP 02043776 A * 2/1990
(Continued)

OTHER PUBLICATIONS

Machine translation of JPH03-276683A. (Year: 1991).*
(Continued)

*Primary Examiner* — Eric R Smith
(74) *Attorney, Agent, or Firm* — Hamre, Schumann, Mueller & Larson, P.C.

(57) ABSTRACT

An organic thin film photovoltaic device module includes: a substrate; a first and second transparent electrode layers disposed on the substrate; an organic layer disposed on the substrate and the first and second transparent electrode layers; a plurality of dot-shaped contact holes formed so as to pass through up to the second transparent electrode layer in a perpendicular-to-plane direction with respect to the organic layer; a metal electrode layer disposed on the organic layer and on the second transparent electrode layer via the dot-shaped contact hole; and a passivation layer disposed on the metal electrode layer. There are provided: the organic thin film photovoltaic device module having satisfactory appearance without deteriorating appearance thereof and having the improved structure of the portion jointed in series; and the electronic apparatus.

3 Claims, 25 Drawing Sheets

(51) Int. Cl.
*H01L 51/42* (2006.01)
*H01L 51/00* (2006.01)

(52) U.S. Cl.
CPC ........ *H01L 51/448* (2013.01); *H01L 51/0036* (2013.01); *H01L 51/0047* (2013.01); *Y02E 10/549* (2013.01); *Y02P 70/50* (2015.11)

(56) References Cited

U.S. PATENT DOCUMENTS

| | | | | |
|---|---|---|---|---|
| 4,773,943 | A * | 9/1988 | Yamaguchi | H01L 31/046 136/244 |
| 2009/0151776 | A1* | 6/2009 | Schindler | B82Y 10/00 136/251 |
| 2010/0015752 | A1* | 1/2010 | Brabec | H01L 27/301 438/73 |
| 2010/0078075 | A1* | 4/2010 | Tsukahara | B82Y 10/00 136/263 |
| 2010/0229914 | A1* | 9/2010 | Adriani | H01L 31/0475 136/244 |
| 2011/0017271 | A1* | 1/2011 | Tsai | H01L 31/02242 136/246 |
| 2012/0097229 | A1* | 4/2012 | Aoki | B82Y 30/00 136/255 |

FOREIGN PATENT DOCUMENTS

| | | |
|---|---|---|
| JP | H3-276683 A | 12/1991 |
| JP | 2004-165513 A | 6/2004 |
| JP | 2007-534119 A | 11/2007 |
| JP | 2010-87339 A | 4/2010 |
| JP | 2013-115084 A | 6/2013 |

OTHER PUBLICATIONS

Machine translation of JP02-043776A [retrieved from https://www.j-platpat.inpit.go.jp on Sep. 10, 2019].*
International Search Report, International Patent Application No. PCT/JP2015/061331 with English translation (5 pages).

* cited by examiner

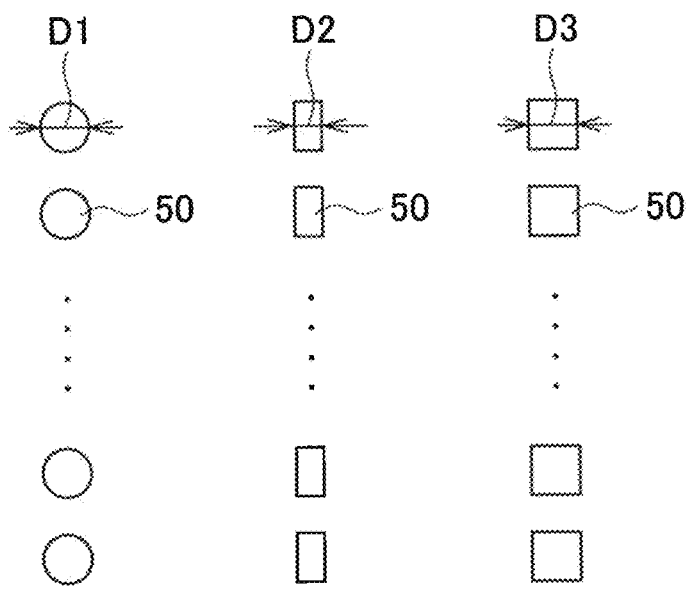
FIG. 17A    FIG. 17B    FIG. 17C
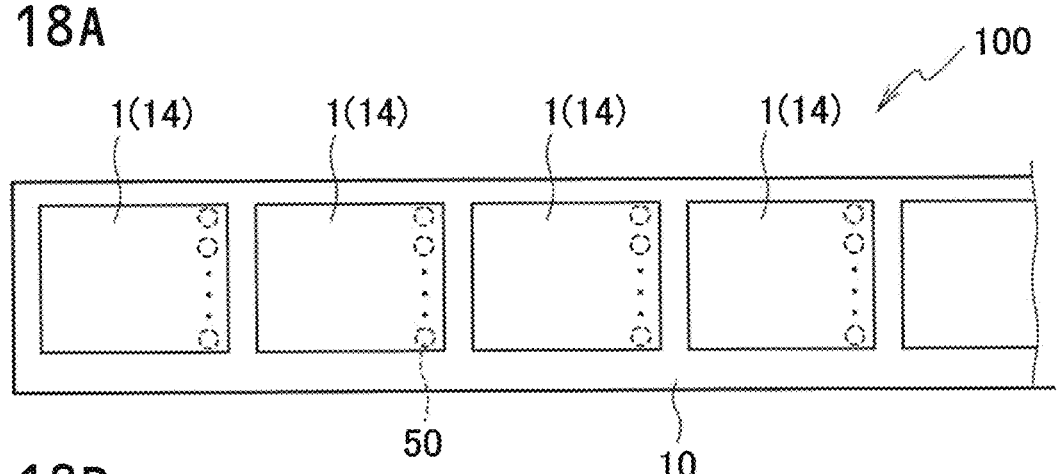
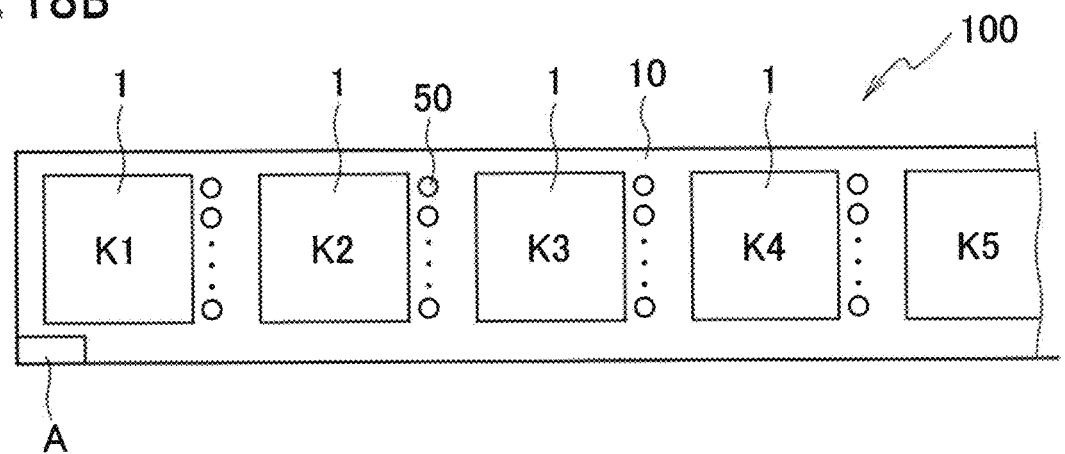

ORGANIC THIN FILM PHOTOVOLTAIC DEVICE MODULE AND ELECTRONIC APPARATUS

CROSS REFERENCE TO RELATED APPLICATIONS

This is a continuation application (CA) of PCT Application No. PCT/JP2015/061331, filed on Apr. 13, 2015, which claims priority to Japan Patent Application No. P2014-176185 filed on Aug. 29, 2014 and is based upon and claims the benefit of priority from prior Japanese Patent Application No. P2014-176185 filed on Aug. 29, 2014 and PCT Application No. PCT/JP2015/061331, filed on Apr. 13, 2015, the entire contents of each of which are incorporated herein by reference.

FIELD

The embodiment described herein relates to an organic thin film photovoltaic device module and an electronic apparatus.

BACKGROUND

Since organic thin film photovoltaic devices characterized by ultra-thin structure, lightness in weight, and flexibility are fabricated using printing methods, e.g. an ink-jet process, under room temperature and atmospheric pressure, well-designed solar cells having a high flexibility of shape can be realized.

In ordinary organic thin film photovoltaic device modules, in order to realize a high open voltage, there have been adopted structures so that adjacent cells are connected to one another in series so as to be overlapped one another in a strip shape.

SUMMARY

The embodiment provides: The embodiment provides: an organic thin film photovoltaic device module having satisfactory appearance without deteriorating appearance thereof; and an electronic apparatus.

According to one aspect of the embodiment, there is provided an organic thin film photovoltaic device module comprising: a substrate; first and second transparent electrode layers disposed on the substrate; an organic layer disposed on the substrate and the first and second transparent electrode layers; a plurality of dot-shaped contact holes formed so as to pass through up to the second transparent electrode layer in a perpendicular-to-plane direction with respect to the organic layer; a metal electrode layer disposed on the organic layer and on the second transparent electrode layer via the dot-shaped contact hole; and a passivation layer disposed on the metal electrode layer.

According to another aspect of the embodiment, there is provided an organic thin film photovoltaic device module comprising an organic thin film photovoltaic device cell, the organic thin film photovoltaic device cell comprising: a substrate; first and second transparent electrode layers disposed on the substrate; an organic layer disposed on the substrate and the first and second transparent electrode layers; a plurality of dot-shaped contact holes formed so as to pass through up to the second transparent electrode layer in a perpendicular-to-plane direction with respect to the organic layer; a metal electrode layer disposed on the organic layer and on the second transparent electrode layer via the dot-shaped contact hole; and a passivation layer disposed on the metal electrode layer, wherein a plurality of the organic thin film photovoltaic device cells are connected to one another in series.

According to still another aspect of the embodiment, there is provided an electronic apparatus comprising the above-mentioned organic thin film photovoltaic device module.

According to the embodiment, there can be provided: the organic thin film photovoltaic device module having satisfactory appearance without deteriorating appearance thereof and having the improved structure of the portion jointed in series; and the electronic apparatus.

BRIEF DESCRIPTION OF DRAWINGS

FIG. 17A shows an arrangement example of circular dots as a shape of the dot-shaped contact holes, in the organic thin film photovoltaic device module according to the embodiment.

FIG. 17B shows an arrangement example of rectangular dots, in the organic thin film photovoltaic device module according to the embodiment.

FIG. 17C shows an arrangement example of square dots, in the organic thin film photovoltaic device module according to the embodiment.

FIG. 18A shows an arrangement example to which the circular-dot-shaped contact holes are applied, as a schematic planar pattern configuration diagram at the side of the light-receiving surface, in the organic thin film photovoltaic device module according to the embodiment.

FIG. 18B is a schematic planar pattern configuration diagram at the side of the terminal-extracting surface, in the organic thin film photovoltaic device module according to the embodiment.

DESCRIPTION OF EMBODIMENTS

Figure 1:
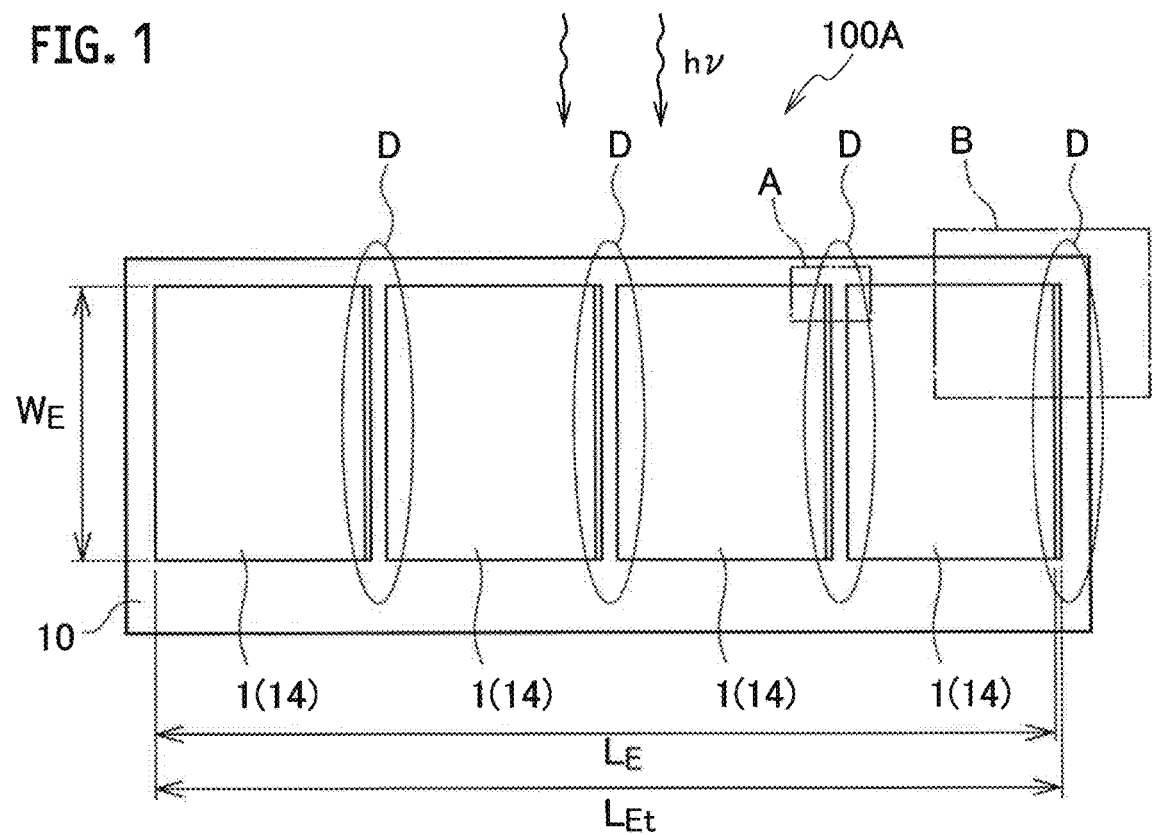
FIG. 1 is a schematic planar pattern configuration diagram showing a side of a light-receiving surface of an organic thin film photovoltaic device module according to a comparative example.

Next, the embodiment will be described with reference to drawings. In the description of the following drawings, the identical or similar reference numeral is attached to the identical or similar part. However, it should be noted that the drawings are schematic and therefore the relation between thickness and the plane size and the ratio of the thickness differs from an actual thing. Therefore, detailed thickness and size should be determined in consideration of the following explanation. Of course, the part from which the relation and ratio of a mutual size differ also in mutually drawings is included.

Moreover, the embodiment shown hereinafter exemplifies the apparatus and method for materializing the technical idea; and the embodiment does not specify the material, shape, structure, placement, etc. of each component part as the following. The embodiment may be changed without departing from the spirit or scope of claims.

In an organic thin film photovoltaic device module according to the following embodiment, "transparent" is defined as that whose transmissivity is not less than approximately 50%. In the organic thin film photovoltaic device module according to the embodiment, the "transparent" is used for the purpose of being transparent and colorless with respect to visible light. The visible light is equivalent to light having a wavelength of approximately 360 nm to approximately 830 nm and energy of approximately 3.45 eV to approximately 1.49 eV, and it can be said that it is transparent if the transmission rate is not less than 50% in such a region.

Comparative Example

Figure 2:
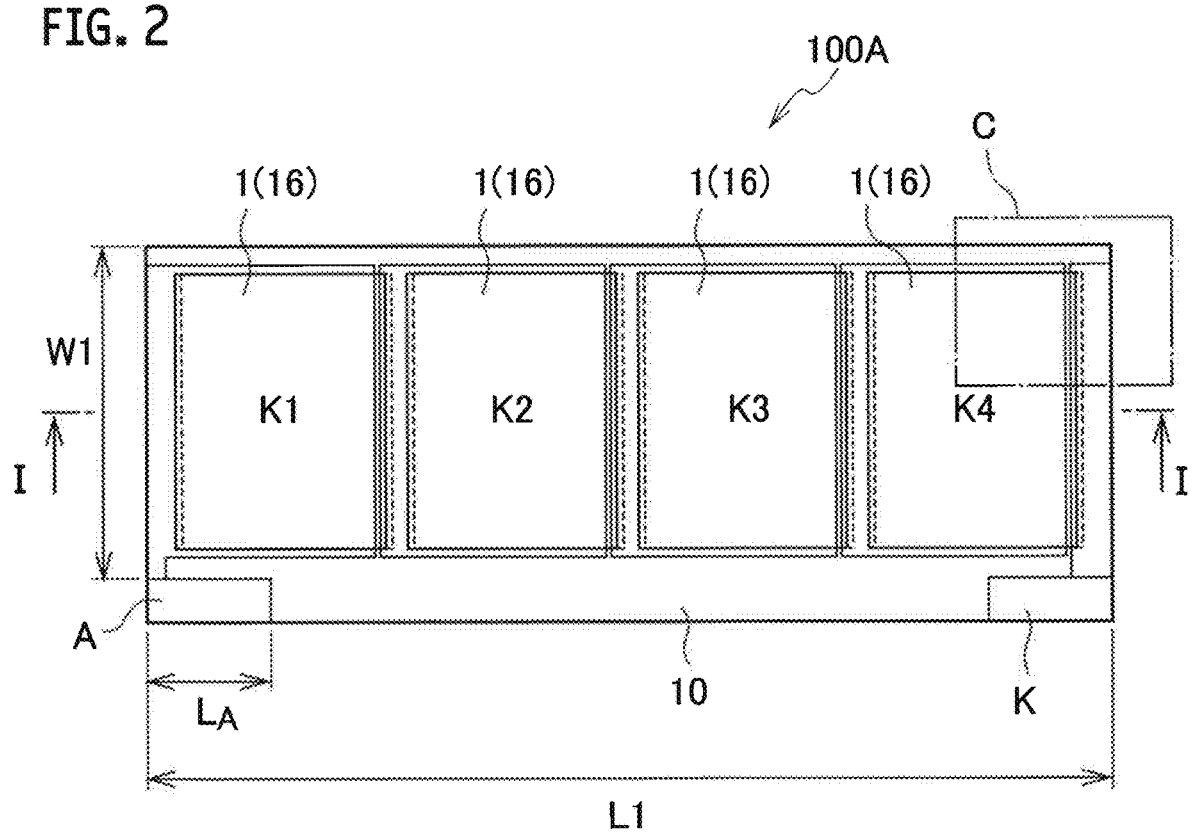
FIG. 2 is a schematic planar pattern configuration diagram showing a side of a terminal-extracting surface of the organic thin film photovoltaic device module according to the comparative example.

FIG. 1 shows a schematic planar pattern configuration at a side of a light-receiving surface of the organic thin film photovoltaic device module 100A according to a comparative example, and FIG. 2 shows a schematic planar pattern configuration at a side of a terminal-extracting surface thereof. Moreover, FIG. 3 shows a schematic cross-sectional structure taken in the line I-I of FIG. 2, and FIG. 4 shows an example of an optical micrograph corresponding to the portion A shown in FIG. 1.

Figure 5:
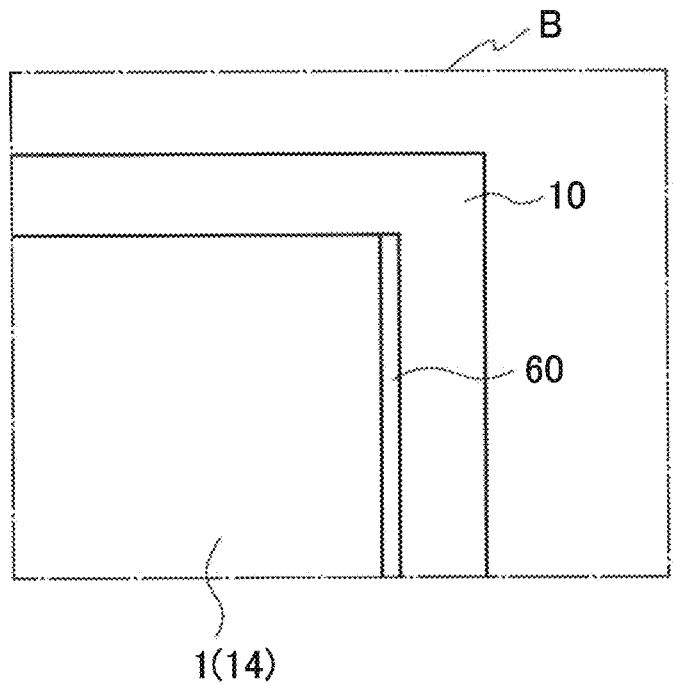
FIG. 5 is a schematic enlarged view showing the portion B shown in FIG. 1.
Figure 6:
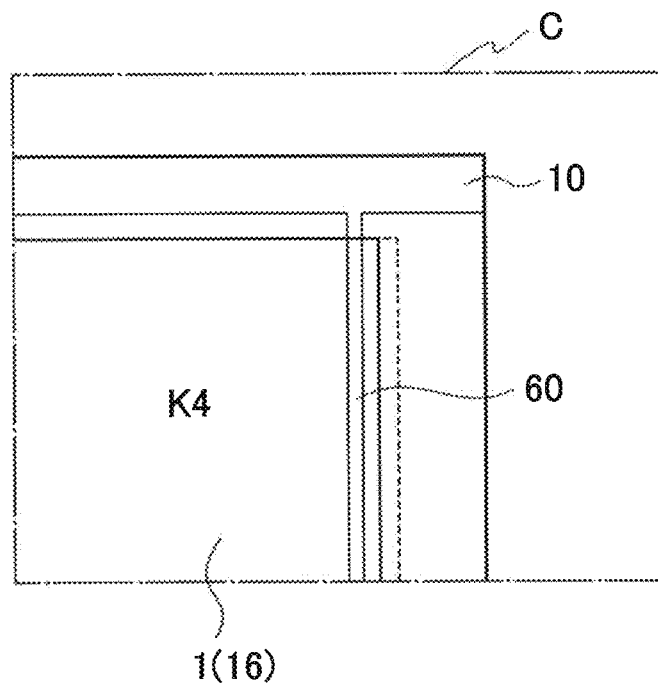
FIG. 6 is a schematic enlarged view showing the portion C shown in FIG. 2.

Moreover, FIG. 5 shows a schematic enlarged view of the portion B shown in FIG. 1, and FIG. 6 shows a schematic enlarged view of the portion C shown in FIG. 2.

Figure 3:
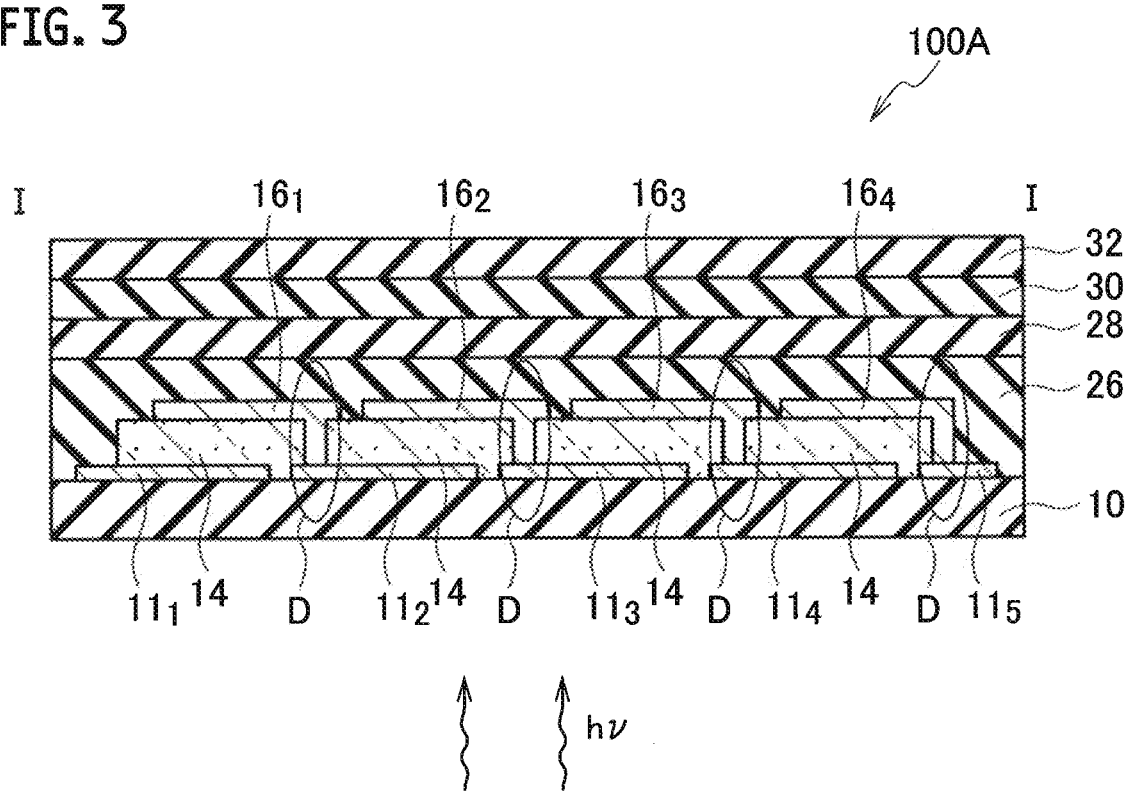
FIG. 3 is a schematic cross-sectional structure diagram taken in the line I-I of FIG. 2.
Figure 4:
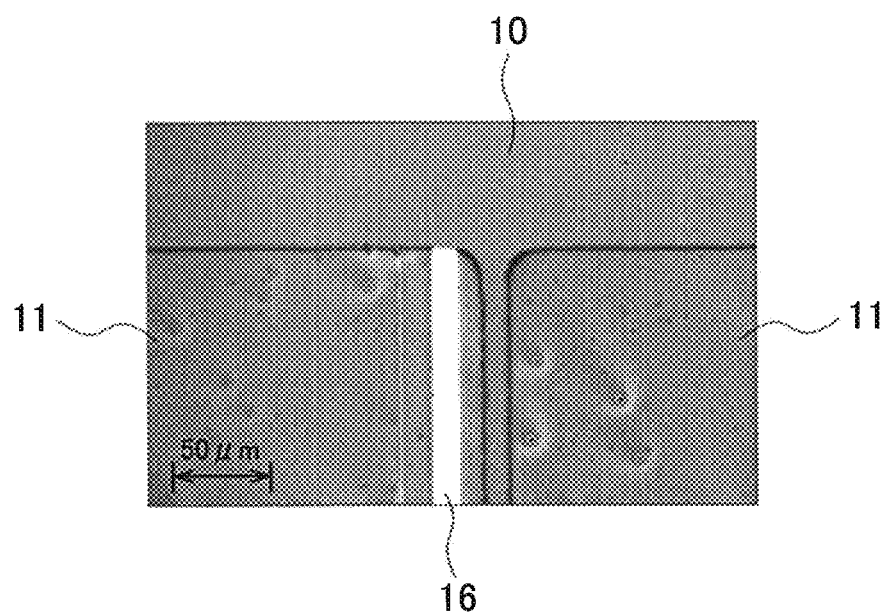
FIG. 4 shows an example of an optical micrograph corresponding to the portion A shown in FIG. 1.

As shown in FIGS. 1-3, the organic thin film photovoltaic device module 100A according to the comparative example includes: a substrate 10; a first transparent electrode layer $11_1$ and a second transparent electrode layer $11_2$ disposed on the substrate 10; an organic layer 14 disposed on the substrate 10 and the transparent electrode layers $11_1$, $11_2$, $11_3$, $11_4$, $11_5$; a striped contact hole formed so as to pass through up to the transparent electrode layers $11_2$, $11_3$, $11_4$, $11_5$ in a perpendicular-to-plane direction with respect to the organic layer 14; a metal electrode layer disposed on the transparent electrode layers $11_2$, $11_3$, $11_4$, $11_5$ and on the organic layer 14 via the striped contact hole; and passivation layers 26, 28, 30, 32 disposed on the metal electrode layers $16_1$, $16_2$, $16_3$, $16_4$.

Figure 7:
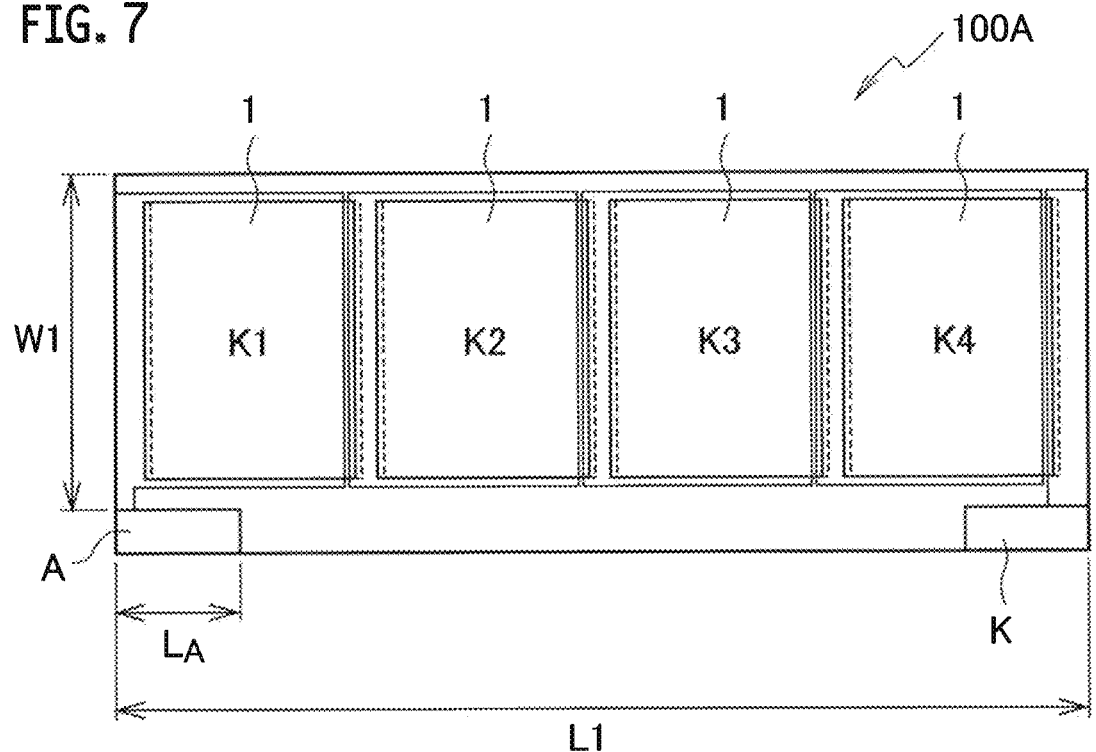
FIG. 7 is an explanatory diagram of a size of each unit at the side of the terminal-extracting surface of the organic thin film photovoltaic device module according to the comparative example.
Figure 8:
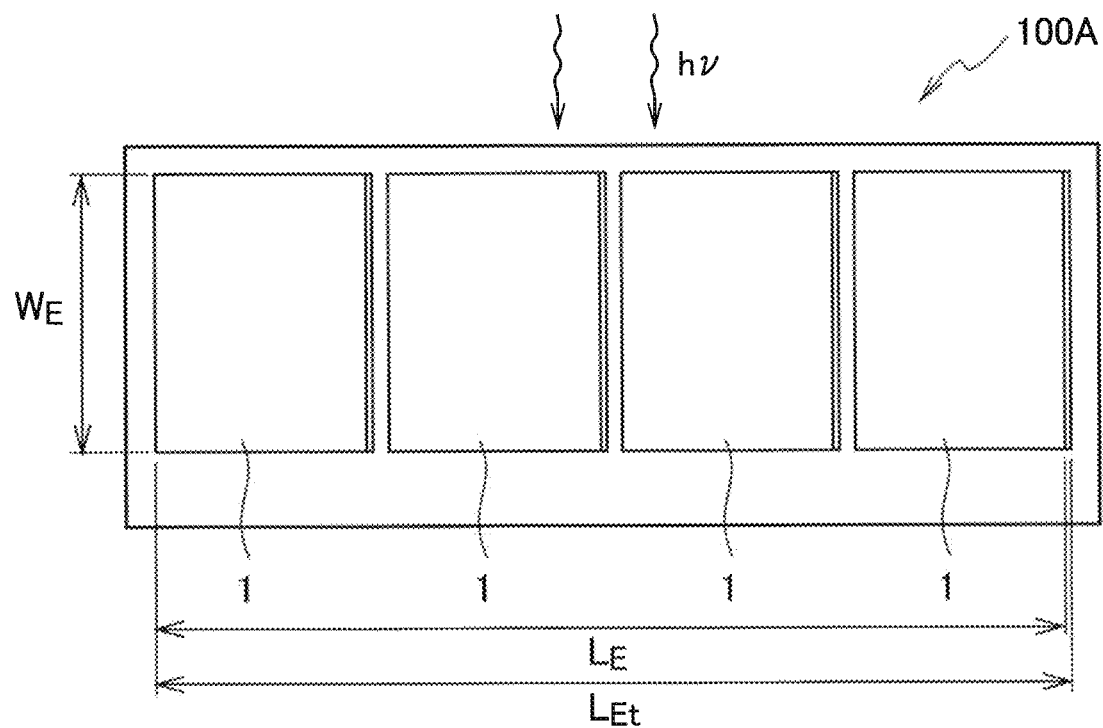
FIG. 8 is an explanatory diagram of a size of each unit at the side of the light-receiving surface of the organic thin film photovoltaic device module according to the comparative example.

FIG. 7, shows an explanatory diagram of a size of each unit at a side of a terminal-extracting surface of the organic thin film photovoltaic device module according to the comparative example, and FIG. 8 shows an explanatory diagram of a size of each unit at a side of a light-receiving surface.

In FIG. 7, the width W1 of the organic thin film photovoltaic device module according the comparative example is approximately 10.3 mm, for example, the module length $L_1$ thereof is approximately 29.6 mm, for example, and the length $L_A$ of an anode extracting electrode A is approximately 3.8 mm, for example.

In FIG. 8, the cell width $W_E$ of the organic thin film photovoltaic device module according to the comparative example is approximately 8.6 mm, for example, and the cell length $L_C$ thereof is approximately 6.75 mm, for example. Moreover, the length $L_E$ of the light-receiving effective region having a 4-cells serial structure is approximately 27.85 mm, for example, and the length $L_{Et}$ of the entire light-receiving effective region is approximately 28.2 mm, for example.

In the organic thin film photovoltaic device module 100A according to the comparative example, since an organic power generation layer (organic photovoltaic layer) is exposed to an external atmosphere when the transparent electrode layer and the metal electrode layer are bonded to each other, the organic power generation layer arbitrarily is separately coated directly using a printing method, e.g. an ink-jet process; or the organic layer is scribed into a stripe shape using high-density oxygen plasma or semiconductor lasers (e.g., a wavelength thereof is approximately 532 nm), and mechanical scribers.

In the organic thin film photovoltaic device module 100A, in order to realize a high open voltage, there have been adopted structures so that adjacent organic thin film photovoltaic device cells are connected to one another in series so as to be overlapped one another in a strip shape. However, at the portion D where the cells are bonded to each other, since the transparent electrode layer 11 and the metal electrode layer 16 are directly contacted with each other, a stripe line 60 of the metal electrode layer 16 exposed to the outer appearance as shown in FIGS. 4 to 6, and thereby the outer appearance is impaired.

Embodiment

Figure 9:
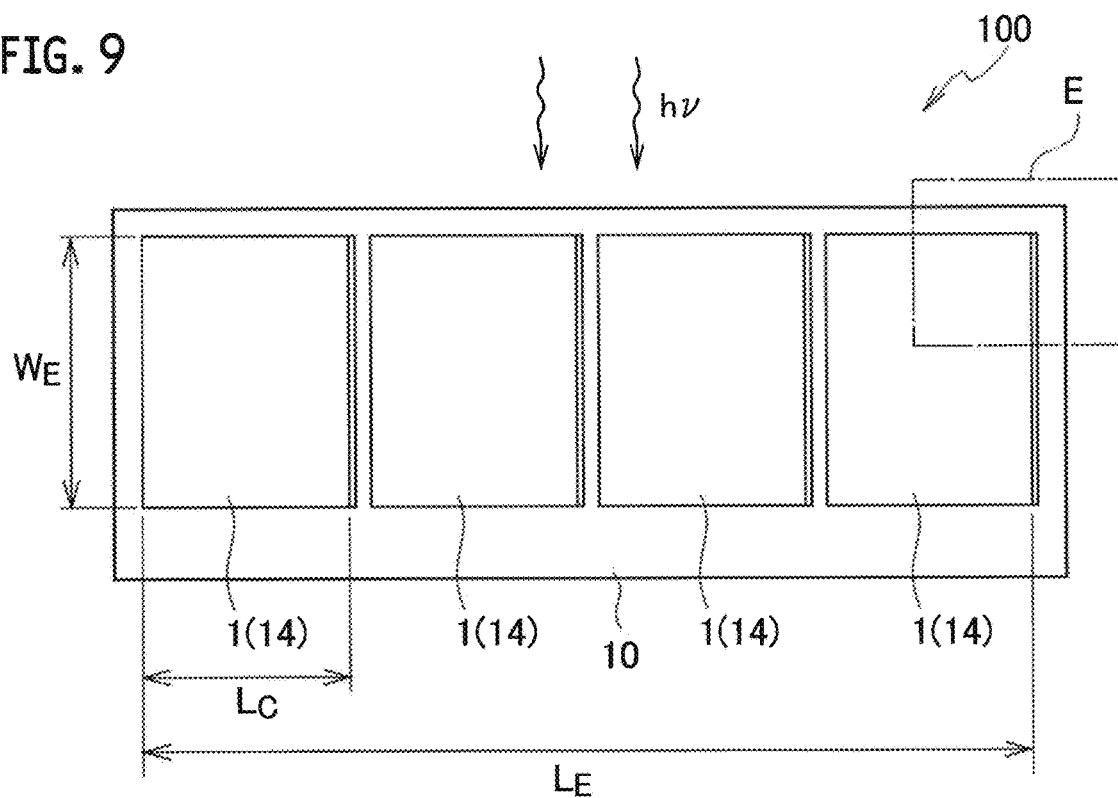
FIG. 9 is a schematic planar pattern configuration diagram at a side of a light-receiving surface of an organic thin film photovoltaic device module according to the embodiment.
Figure 10:
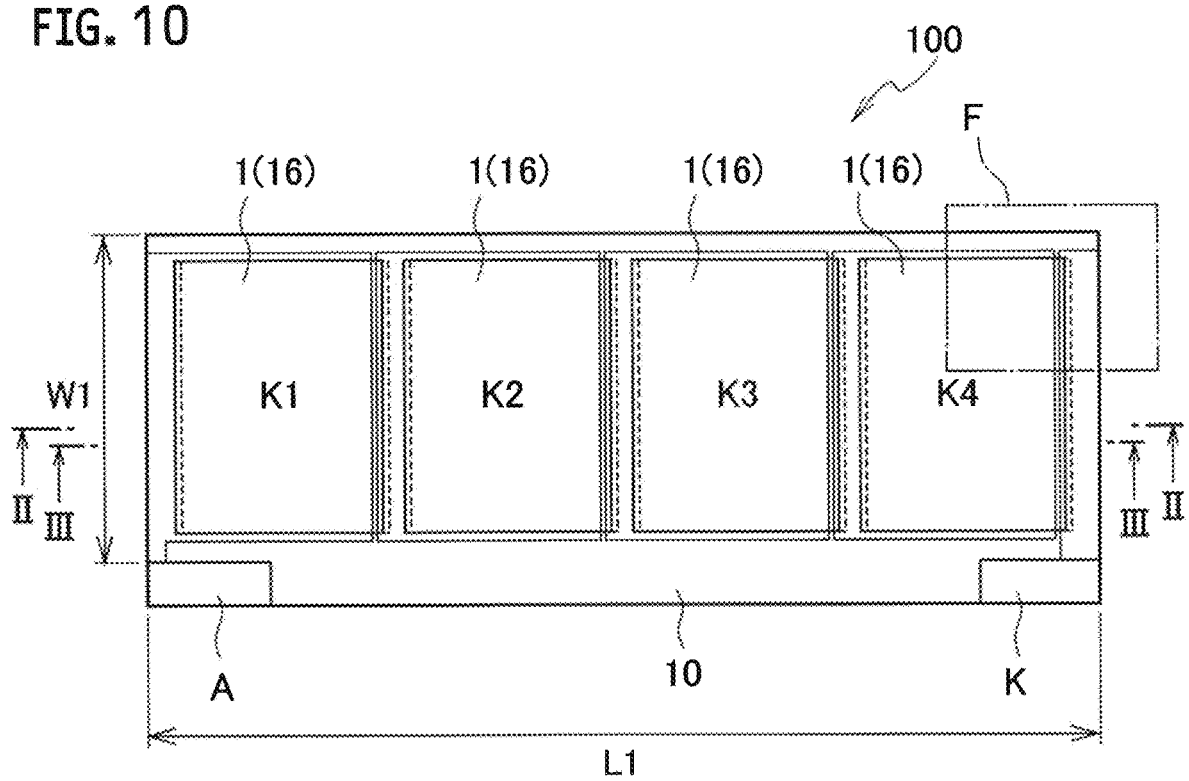
FIG. 10 is a schematic planar pattern configuration diagram at a side of a terminal-extracting surface of the organic thin film photovoltaic device module according to the embodiment.

FIG. 9 shows a schematic planar pattern configuration at the a of a light-receiving surface of an organic thin film photovoltaic device module 100 according to the embodiment, and FIG. 10 shows a schematic planar pattern configuration at a side of a terminal-extracting surface thereof. Moreover, a schematic enlarged view of E portion of FIG. 9 is expressed as shown in FIG. 11, and a schematic enlarged view of F portion of FIG. 10 is expressed as shown in FIG. 12.

Figure 11:
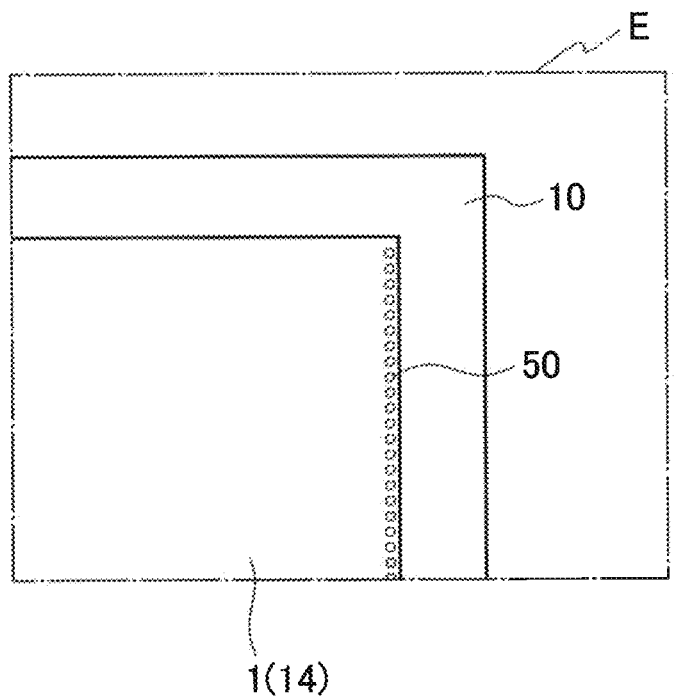
FIG. 11 is a schematic enlarged view showing the portion E shown in FIG. 9.
Figure 12:
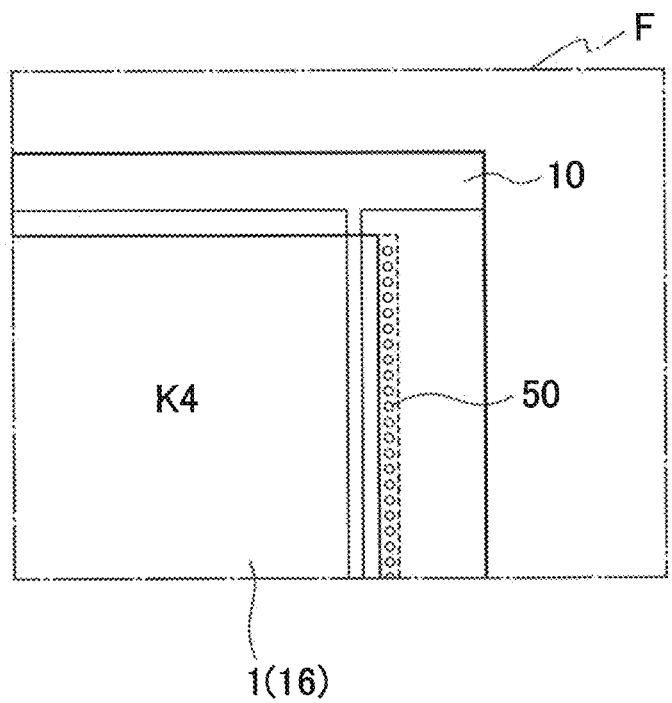
FIG. 12 is a schematic enlarged view showing the portion F shown in FIG. 10.

In the organic thin film photovoltaic device module 100 according to the embodiment, a joined portion between the transparent electrode layer 11 and the metal electrode layer 16 provided in order to connect in series the adjacent organic thin film photovoltaic device cells 1 is not provided in stripe shape, an influence on the outer appearance is controlled by arranging dot-shaped contact holes 50 at a fixed interval, as shown in FIGS. 11-12.

Figure 13:
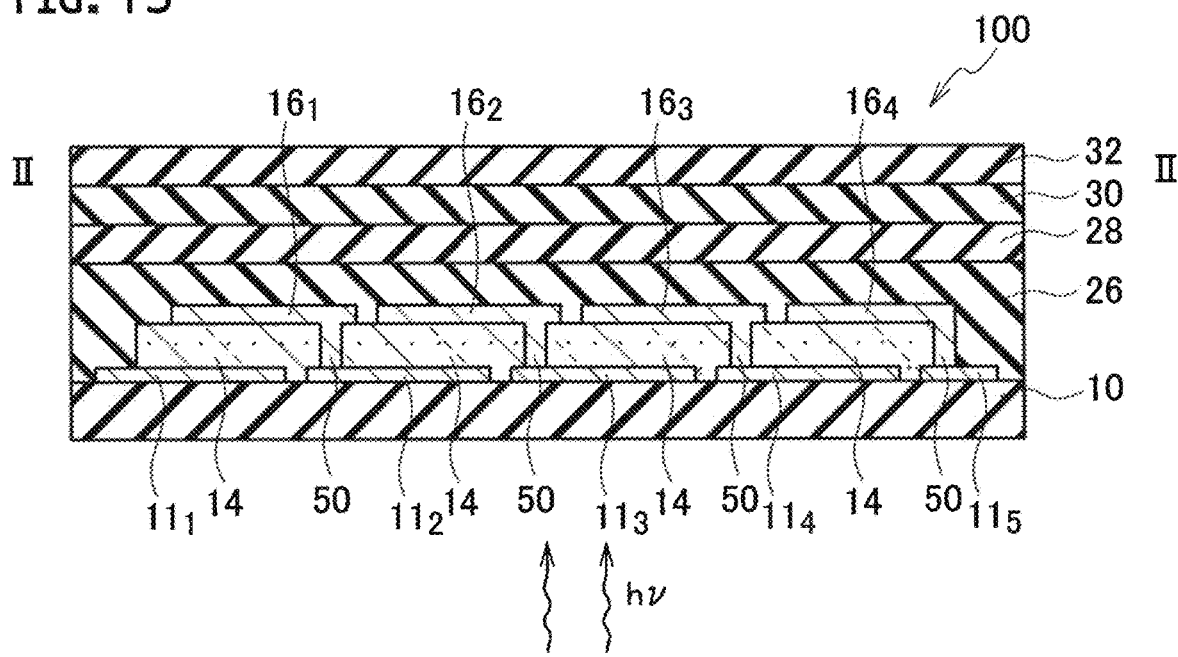
FIG. 13 is a schematic cross-sectional structure diagram taken in the line II-II of FIG. 10 corresponding to a portion with dot-shaped contact holes, in the organic thin film photovoltaic device module according to the embodiment.
Figure 14:
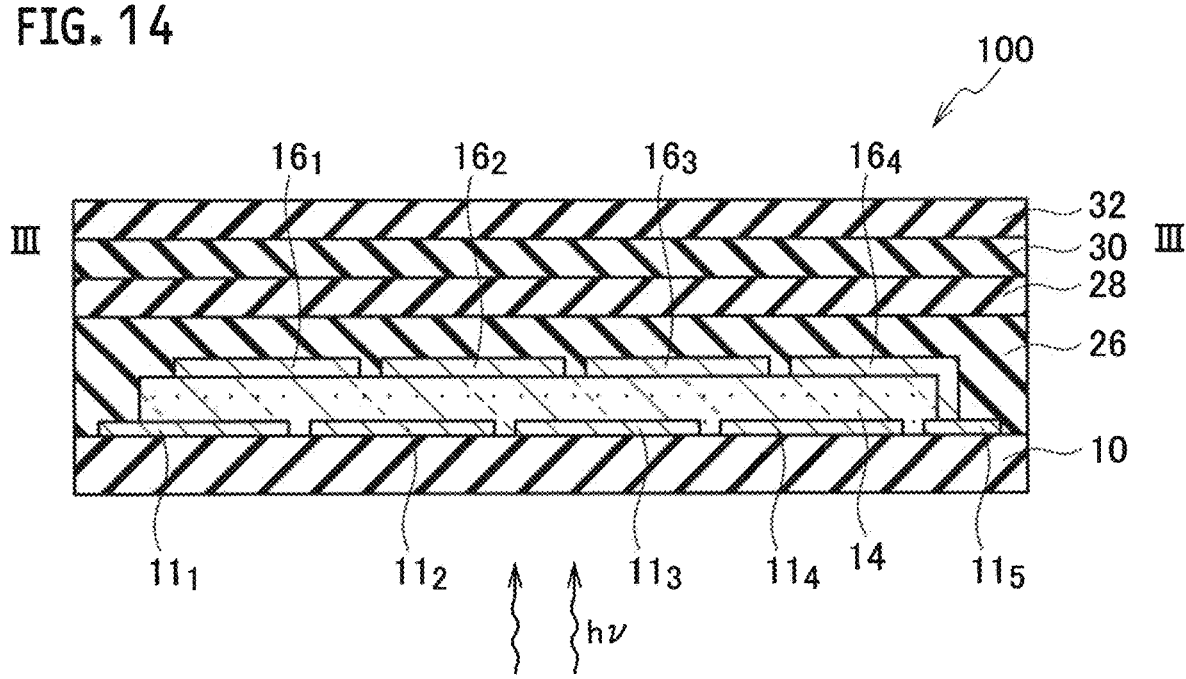
FIG. 14 is a schematic cross-sectional structure diagram taken in the line III-III of FIG. 10 corresponding to a portion without dot-shaped contact holes, in the organic thin film photovoltaic device module according to the embodiment.

FIG. 13 shows a schematic cross-sectional structure taken in the line II-II of FIG. 10 corresponding to a portion with dot-shaped contact holes, in the organic thin film photovoltaic device module 100 according to the embodiment. FIG. 14 shows a schematic cross-sectional structure taken in the line III-III of FIG. 10 corresponding to a portion without dot-shaped contact holes 50.

As shown in FIGS. 9-14, the organic thin film photovoltaic device module 100 according to the embodiment includes: a substrate 10; transparent electrode layers $11_1$, $11_2$, $11_3$, $11_4$, $11_5$ disposed on the substrate 10; an organic layer 14 disposed on the substrate 10 and the transparent electrode layers $11_1$, $11_2$, $11_3$, $11_4$, $11_5$; a plurality of dot-shaped contact holes 50 formed so as to pass through up to the transparent electrode layers $11_2$, $11_3$, $11_4$, $11_5$ in a perpendicular-to-plane direction with respect to the organic layer 14; metal electrode layers $16_1$, $16_2$, $16_3$, $16_4$ disposed on the organic layer 14 and on the transparent electrode layers $11_2$, $11_3$, $11_4$, $11_5$ via the dot-shaped contact holes 50; and passivation layers 26, 28, 30, 32 disposed on the metal electrode layers $16_1$, $16_2$, $16_3$, $16_4$.

Moreover, as shown in FIGS. 9-14, in the organic thin film photovoltaic device module 100 according to the embodiment, a plurality of organic thin film photovoltaic device cells may be connected in series, the organic thin film photovoltaic device cell including: a substrate 10; transparent electrode layers $11_1$, $11_2$ disposed on the substrate 10; an organic layer 14 disposed on the substrate 10 and the transparent electrode layer $11_1$, $11_2$; a plurality of dot-shaped contact holes 50 formed so as to pass through up to the transparent electrode layer $11_2$ in a perpendicular-to-plane direction with respect to the organic layer 14; a metal electrode layer $16_1$ disposed on the organic layer 14 and on the transparent electrode layer $11_2$ via the dot-shaped contact hole 50; and passivation layers 26, 28, 30, 32 disposed on the metal electrode layer $16_1$.

In the present embodiment, the dot-shaped contact hole 50 may have a shape of any one of a circular shape, rectangular shape or square shape.

The passivation layers 26, 28, 30, 32 may include an SiN film or SiON film.

Moreover, a multi-laminated protection film may be formed by repeatedly laminating a plurality of the passivation layers 26. For example, the passivation layers 26, 30 are formed including an inorganic protection film, e.g. an SiN film or SiON film; and the passivation layers 28, 32 may be formed including an organic protective film, e.g. a resin layer.

In the organic thin film photovoltaic device module 100 according to the embodiment, in order to realize a high open voltage, there have been adopted structures so that adjacent organic thin film photovoltaic device cells are connected to one another in series so as to be overlapped one another in a strip shape. In addition, an influence on the outer appearance can be controlled by arranging the dot-shaped contact holes 50 for a joined portion between the transparent electrode layer 11 and the metal electrode layer 16 provided in order to connect the adjacent organic thin film photovoltaic device cells 1 to each other in series, at a fixed interval or unfixed interval.

Figure 15:
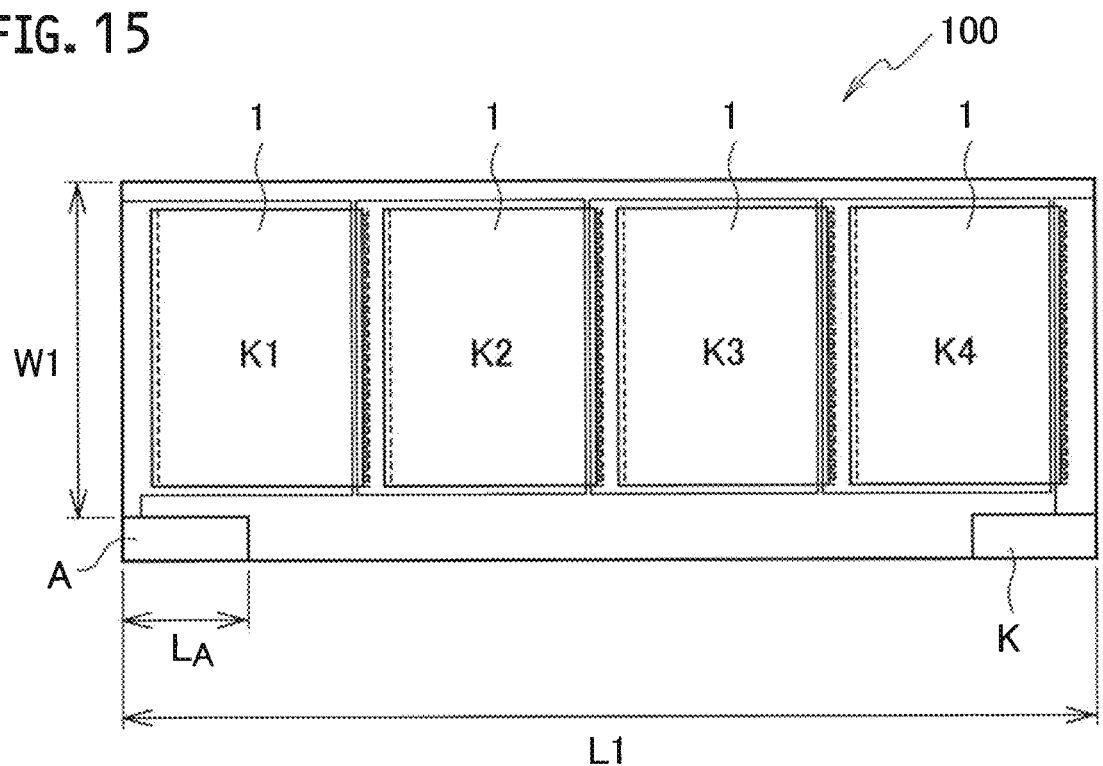
FIG. 15 is an explanatory diagram of a size of each unit at the side of the terminal-extracting surface of the organic thin film photovoltaic device module according to the embodiment.
Figure 16:
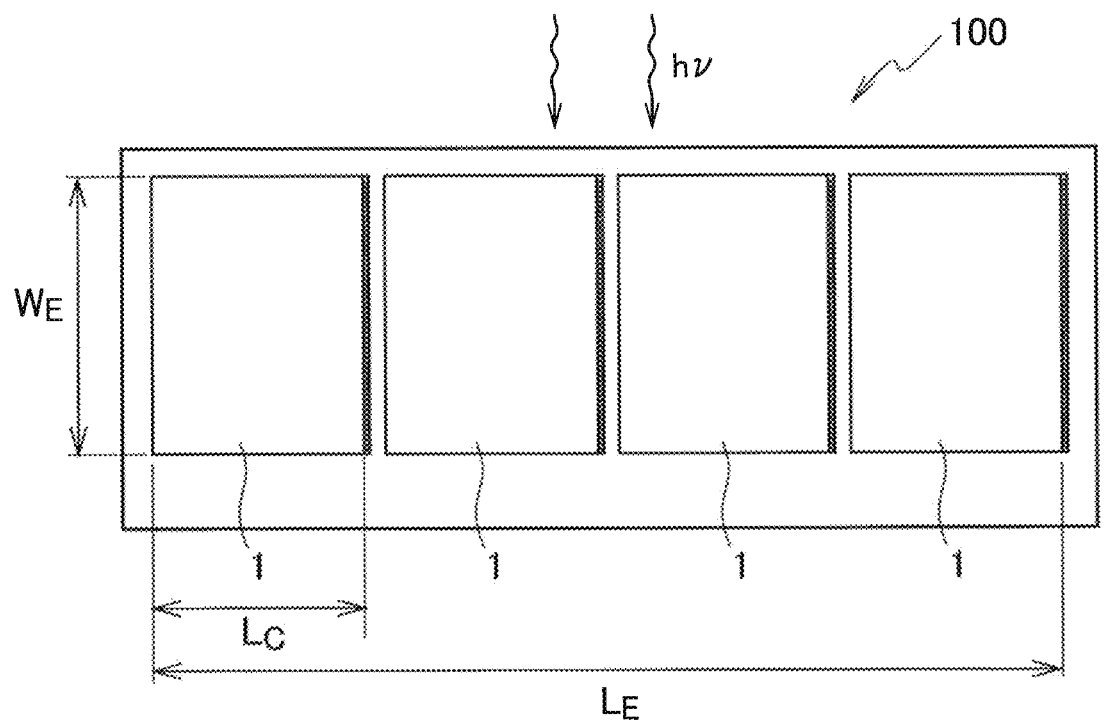
FIG. 16 is an explanatory diagram of a size of each unit at the side of the light-receiving surface of the organic thin film photovoltaic device module according to the embodiment.

FIG. 15, shows an explanatory diagram of a size of each unit at a side of a terminal-extracting surface of the organic thin film photovoltaic device module according to the embodiment, and FIG. 16 shows an explanatory diagram of a size of each unit at a side of a light-receiving surface.

In FIG. 15, the width W1 of the organic thin film photovoltaic device module according the embodiment is approximately 10.3 mm, for example, the module length L1 thereof is approximately 29.6 mm, for example, and the length $L_A$ of an anode extracting electrode A is approximately 3.8 mm, for example.

In FIG. 16, the cell width $W_E$ of the organic thin film photovoltaic device module according to the embodiment is approximately 8.6 mm, for example, and the cell length $L_c$ thereof is approximately 6.75 mm, for example. Moreover, the length $L_E$ of the light-receiving effective region having a 4-cells serial structure is approximately 27.85 mm, for example, and the length $L_{Et}$ of the entire light-receiving effective region is approximately 28.2 mm, for example.

In the organic thin film photovoltaic device module 100 according to the embodiment, FIG. 17A shows an arrangement example of circular dots as a shape of the dot-shaped contact holes 50, FIG. 17B shows an arrangement example of rectangular dots, and FIG. 17C shows an arrangement example of square dots. In the present embodiment, the diameter D1 of the circular dot is approximately 1 μm to approximately 100 μm, for example. The horizontal width D2 of the rectangular dot is also approximately 1 μm to approximately 100 μm, for example. The horizontal width D3 of the square dot is also approximately 1 μm to approximately 100 μm, for example.

Moreover, the interval of each dot is also approximately 10 μm to approximately 100 μm. The interval of each dot may be a fixed interval, or may be unfixed interval.

FIG. 18A shows an arrangement example to which the circular-dot-shaped contact holes 50 are applied, as a schematic planar pattern configuration at the side of the light-receiving surface, in the organic thin film photovoltaic device module 100 according to the embodiment. FIG. 18B shows a schematic planar pattern configuration at the side of the terminal-extracting surface thereof.

Figure 19A:
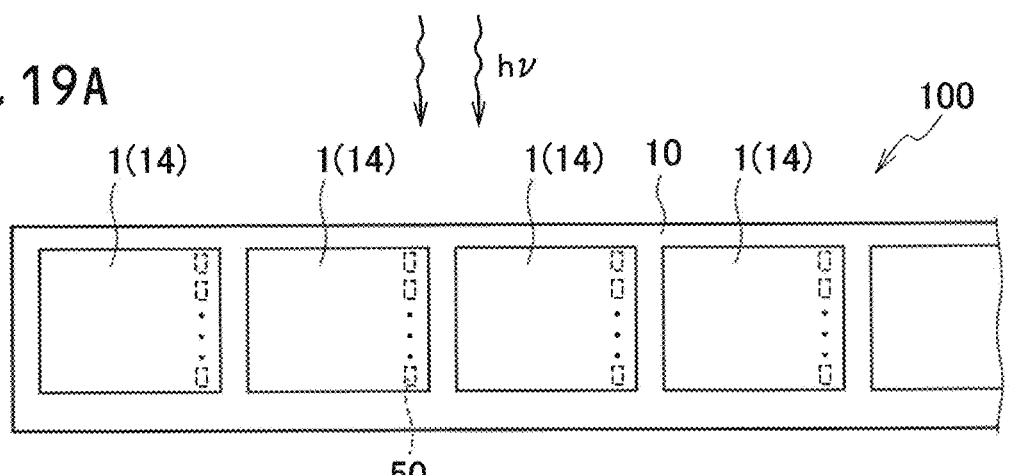
FIG. 19A shows an arrangement example to which the rectangular-dot-shaped contact holes are applied, as a schematic planar pattern configuration diagram at the side of the light-receiving surface, in the organic thin film photovoltaic device module according to the embodiment.
Figure 19B:
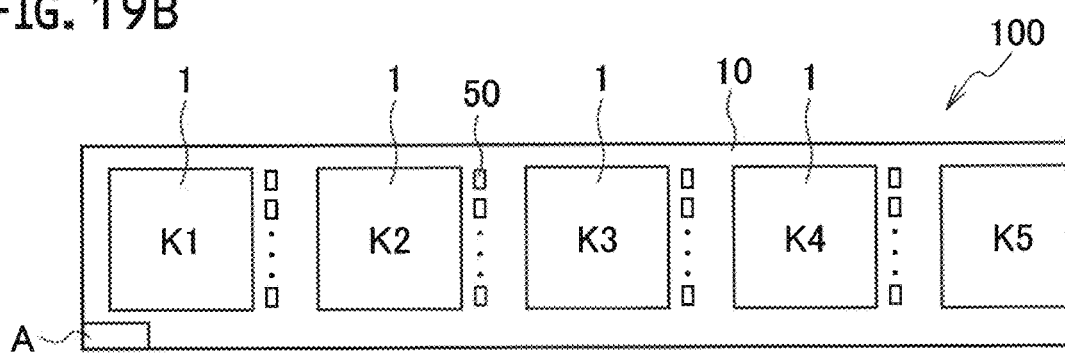
FIG. 19B shows an arrangement example to which the rectangular-dot-shaped contact holes are applied, as a schematic planar pattern configuration diagram at the side of the terminal-extracting surface, in the organic thin film photovoltaic device module according to the embodiment.

Similarly, FIG. 19A shows an arrangement example to which the rectangular-dot-shaped contact holes 50 are applied, as a schematic planar pattern configuration at the side of the light-receiving surface, in the organic thin film photovoltaic device module 100 according to the embodiment. FIG. 19B shows a schematic planar pattern configuration at the side of the terminal-extracting surface thereof.

Figure 20A:
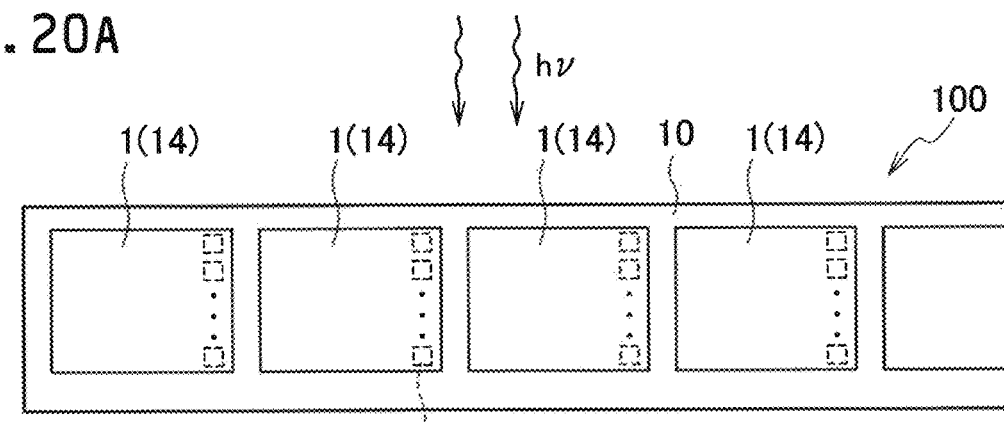
FIG. 20A shows an arrangement example to which the square-dot-shaped contact holes are applied, as a schematic planar pattern configuration diagram at the side of the light-receiving surface, in the organic thin film photovoltaic device module according to the embodiment.
Figure 20B:
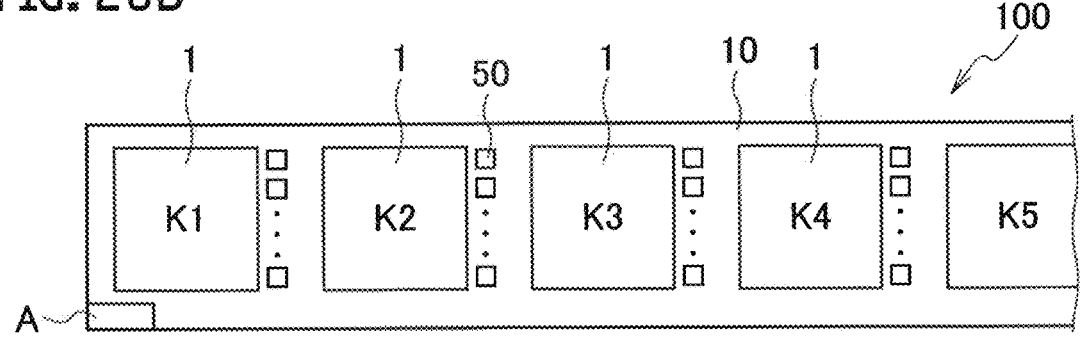
FIG. 20B shows an arrangement example to which the square-dot-shaped contact holes are applied, as a schematic planar pattern configuration diagram at the side of the terminal-extracting surface, in the organic thin film photovoltaic device module according to the embodiment.

Similarly, FIG. 20A shows an arrangement example to which the squarer-dot-shaped contact holes 50 are applied, as a schematic planar pattern configuration at the side of the light-receiving surface, in the organic thin film photovoltaic device module 100 according to the embodiment. FIG. 20B shows a schematic planar pattern configuration at the side of the terminal-extracting surface thereof.

In addition, the shape of the dot-shaped contact hole 50 is not limited to the above-mentioned examples, but it may be arranged in a line shape, e.g. a shape of a dashed line, a shape of a dashed dotted line, etc., although it is not a stripe. More specifically, the dot shape for patterning the organic layer may not be limited to the circular shape, but may be a linear shape, a rectangular parallelopiped shape, a rectangular shape, a square shape, etc. As a shape of a cubic shape, it may be a pillar shape or rectangular parallelopiped shape. The rectangular parallelopiped shape disclosed herein is a cubic shape in which each six cubic plane is a rectangular shape (at least one is always the rectangular shape) or square shape.

In the organic thin film photovoltaic device module 100A according to the comparative example, since an organic power generation layer (organic photovoltaic layer) is exposed to an external atmosphere when the transparent electrode layer and the metal electrode layer are bonded to each other, the organic power generation layer arbitrarily is separately coated directly using a printing method, e.g. an ink-jet process; or the organic layer is scribed into a stripe shape using high-density oxygen plasma or semiconductor lasers (e.g., a wavelength thereof is approximately 532 nm), and mechanical scribers.

On the other hand, in the organic thin film photovoltaic device module 100 according to the embodiment, the junction between the adjacent cell is performed by providing the organic layer at an interval of approximately 10 μm or more (e.g., the circular dots of which the diameter is equal to or larger than approximately 1.0 μm are provided at a fixed or unfixed interval). By adopting such a configuration, the module excellent in a designedness of which the outer appearance of the joined portion is not impaired can be realized.

In the organic thin film photovoltaic device module 100 according to the embodiment, the organic layer 14 may includes a hole transport layer disposed on the transparent electrode layer 11, and a bulk heterojunction organic active layer disposed on the hole transport layer.

Moreover, in the organic thin film photovoltaic device module 100 according to the embodiment, the multi-laminated protection film may includes a passivation layer 26, a passivation layer (colored barrier layer) 28, a back sheet passivation layer 30, and a resin layer 40. The colored barrier layer 28 disclosed herein can be formed of an ultraviolet (UV) curing resin, for example. Moreover, a coloring agent may be added to the colored barrier layer 28. For example, carbon black etc. are applicable as a black coloring agent, phthalocyanine-based coating etc. are applicable as a blue coloring agent, and alizarin-based coating etc. are applicable as a red coloring agent. The colored barrier layer 28 can cover a spot formed in the passivation layer 26, e.g., an SiN film or SiON film. The colored barrier layer 28 disposed on the passivation layer 26 has a role of a protective layer of the cell.

The colored barrier layer 28 can be formed of color filters enabling arbitrary patterning by irradiation with UV rays.

As shown in FIGS. 13 and 14, the organic thin film photovoltaic device module 100 according to the embodiment is made by laminating the organic layer 14 having a thickness of approximately several 100 nm used for a power generation layer (photovoltaic layer) on the glass substrate 10 with ITO, and by evaporating metal layers, e.g. an aluminum, as the second electrode layer 16.

Since pure aluminum formed as the second electrode layer 16 is easily oxidized, a passive state film may be formed thereon in order to improve durability.

Since the organic layer 14 is disposed on the substrate 10, the passive state film formed thereon can prevent the occurrence of damage to the organic layers 14 when forming the passivation layer 26.

According to the embodiment, there can be provided the organic thin film photovoltaic device module having satisfactory appearance without deteriorating appearance thereof and having the improved structure of the portion jointed in series.

(Operational Principle)

Figure 21:
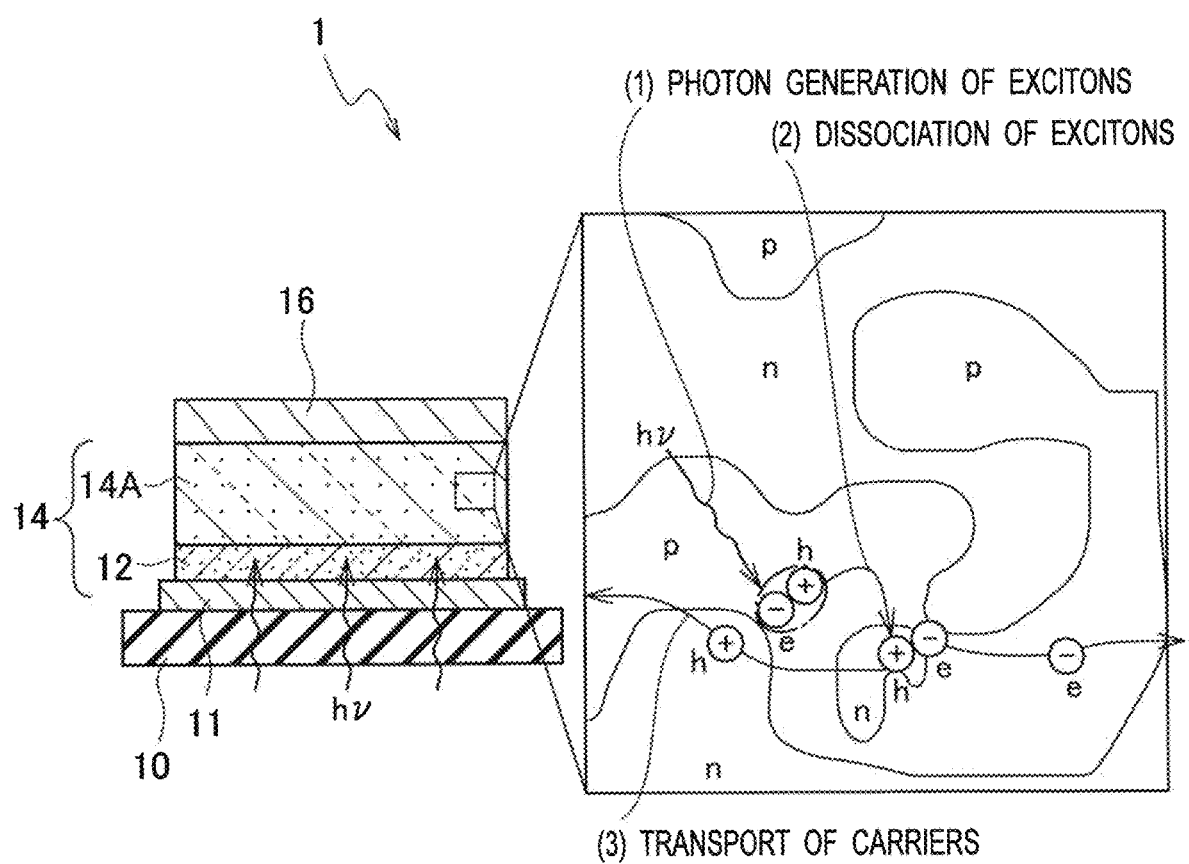
FIG. 21 is a schematic diagram for explaining a theoretic configuration and operation of an organic thin film photovoltaic device cell applicable to the organic thin film photovoltaic device module according to the embodiment.
Figure 22:
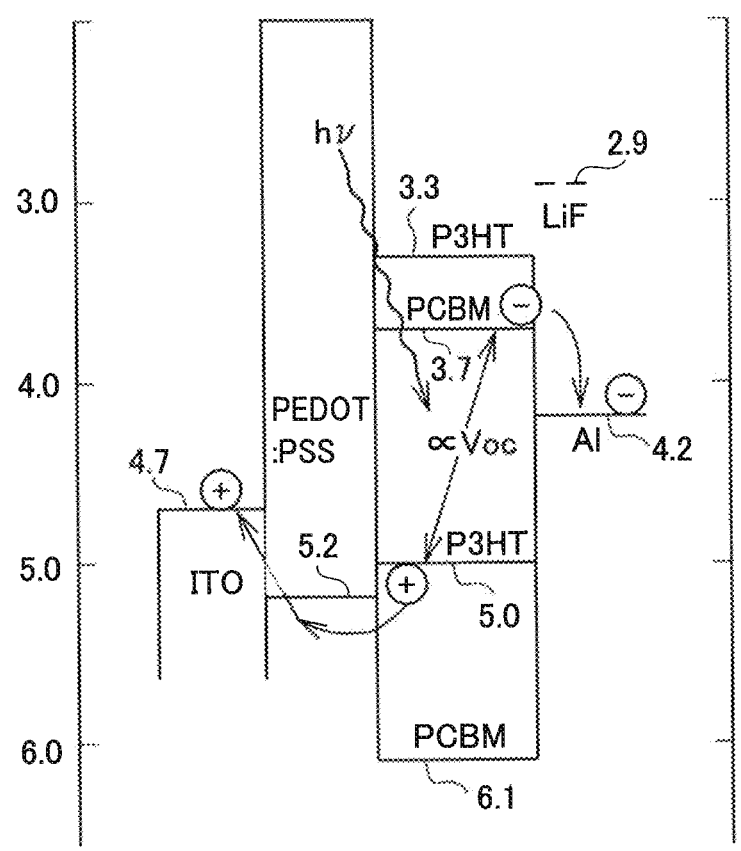
FIG. 22 is an energy band structure diagram showing various kinds of materials of the organic thin film photovoltaic device cell shown in FIG. 21.

FIG. 21 shows a schematic diagram for explaining an operational principle of the organic thin film photovoltaic device cell 1 applicable to the organic thin film photovoltaic device module according to the embodiment. Moreover, an energy band structure of various kinds of materials used for the organic thin film photovoltaic device cell 1 shown in FIG. 21 is expressed as shown in FIG. 22. With reference to FIGS. 21 and 22, there will now be explained theoretic configuration and operation of the organic thin film photovoltaic device cell 1 according to the embodiment.

As shown in the left-hand side of FIG. 21, the organic thin film photovoltaic device cell 1 according to the embodiment includes: a substrate 10; an optically transmissive electrode layer 11 disposed on the substrate 10; a hole transport layer 12 disposed on the optically transmissive electrode layer 11; a bulk heterojunction organic active layer 14A disposed on the hole transport layer 12; and a second electrode layer 16 disposed on the bulk heterojunction organic active layer 14A. The second electrode layer 16 is formed of aluminum (Al), for example, and used for cathode electrode layer.

In this case, the bulk heterojunction organic active layer 14A forms a complicated bulk hetero pn junction such that p type organic active layer regions and n type organic active layer regions are existed, as shown in the right-hand side of FIG. 21. In the embodiment, the p type organic active layer region is formed of P3HT (poly (3-hexylthiophene-2, 5diyl)), for example, and the n type organic active layer region is formed of PCBM (6,6-phenyl-C61-butyric acid methyl ester), for example.

(a) Firstly, when light is absorbed, photon generation of excitons occur in the bulk heterojunction organic active layer 14A.

(b) Next, the excitons are dissociated to free carriers of electrons (e−) and holes (h+) by spontaneous polarization, in the pn junction interfaces in the bulk heterojunction organic active layer 14A.

(c) Next, the dissociated holes (h+) travel towards the optically transmissive electrode layer 11 acting as an anode electrode, and the dissociated electrons (e−) travel towards the cathode electrode layer 16.

(d) As a result, between the cathode electrode layer 16 and the optically transmissive electrode layer 11, a reverse current conducts and an open circuit voltage Voc occurs, and thereby the organic thin film photovoltaic device cell 1 can be obtained.

Figure 23A:
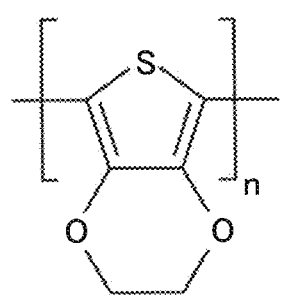
FIG. 23A shows a chemical structural formula of PEDOT applied to the organic thin film photovoltaic device module according to the embodiment.
Figure 23B:
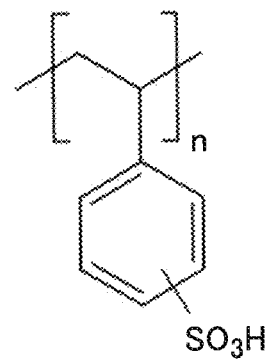
FIG. 23B shows a chemical structural formula of PSS applied to the organic thin film photovoltaic device module according to the embodiment.

In the organic thin film photovoltaic device cell 1, a chemical structural formula of PEDOT is expressed as shown in FIG. 23A, and a chemical structural formula of PSS is expressed as shown in FIG. 23B, among PEDOT: PSS applied to the hole transport layer 12.

Figure 24A:
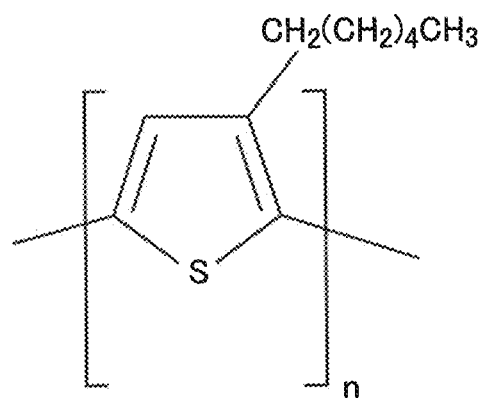
FIG. 24A shows a chemical structural formula of P3HT used as a p type material applied to the organic thin film photovoltaic device module according to the embodiment.
Figure 24B:
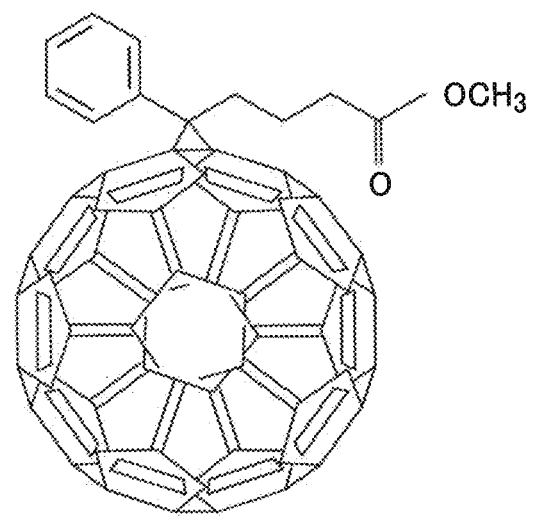
FIG. 24B shows a chemical structural formula of PCBM used as an n type material applied to the organic thin film photovoltaic device module according to the embodiment.

In the organic thin film photovoltaic device cell 1 according to the embodiment, a chemical structural formula of P3HT applied to the bulk heterojunction organic active layer 14A is expressed as shown in FIG. 24A, and a chemical structural formula of PCBM applied to the bulk heterojunction organic active layer 14A is expressed as shown in FIG. 24B.

Although illustration is omitted, the passive state film is composed including an oxide film of the metal electrode layer 16. Moreover, the oxide film of the metal electrode layer 16 can be formed with oxygen plasma treatment applied on the surface of the metal electrode layer 16. The thickness of the passive state film is from approximately 10 angstroms to approximately 100 angstroms, for example. A passivation film disposed on the passive state film may be provided. The passivation film can be composed of an SiN film or an SiON film, for example.

The metal electrode layer 16 may be composed including any one of metals, such as Al, W, Mo, Mn, or Mg. If the metal electrode layer 16 is formed including Al, the passive state film is an alumina ($Al_2O_3$) film.

Even in the case where moisture or oxygen is infiltrated into the organic layer 14, the organic thin film photovoltaic device cell 1 including the passive state film on the surface of the metal electrode layer 16 can prevent a situation where the metal electrode layer 16 is oxidized due to the moisture or oxygen. Accordingly, degradation of the organic thin film photovoltaic device cell can be reduced, thereby improving the durability thereof.

(Fabrication Method)

The organic thin film photovoltaic device 100 according to the embodiment is formed by laminating approximately several 100-nm organic layer 14 used for a power generation layer (photovoltaic layer) on the glass substrate 10 with ITO, and then evaporating a metal, e.g. aluminum. Since a pure aluminum formed as the metal electrode layer 16 is easily oxidized, a multi-laminated protection film formed by laminating an inorganic passivation film and a resin protective film, e.g. SiN, SiON, as a multilayer with Chemical Vapor Deposition (CVD) method is used for a barrier layer in order to give a durability.

A fabrication method of the organic thin film photovoltaic device module 100 according to the embodiment includes: forming transparent electrode layers $11_1$, $11_2$, $11_3$, $11_4$, $11_5$ on a substrate 10; forming an organic layer 14 on the substrate 10 and the transparent electrode layers $11_1$, $11_2$, $11_3$, $11_4$, $11_5$; forming a plurality of dot-shaped contact holes 50 so as to pass through up to the transparent electrode layers $11_2$, $11_3$, $11_4$, $11_5$ in a perpendicular-to-plane direction with respect to the organic layer 14; forming metal electrode layers $16_1$, $16_2$, $16_3$, $16_4$ on the organic layer 14 and on transparent electrode layers $11_2$, $11_3$, $11_4$, $11_5$ via the dot-shaped contact holes 50; and forming passivation layers 26, 28, 30, 32 on the metal electrode layers $16_1$, $16_2$, $16_3$, $16_4$.

The process of forming passivation layers 26, 28, 30, 32 may include forming a multi-laminated protection film.

The process of forming the dot-shaped contact holes 50 may include a patterning process by oxygen plasma.

The process of forming the organic layer 14 may includes a formation process by an ink-jet process.

The process of forming the dot-shaped contact holes 50 may include a process of separately coating and forming the organic layer 14 with the ink-jet process.

There will now be explained the fabrication method of a plurality (three pieces, as an example in Figures) of the organic thin film photovoltaic device modules arranged in series according to the embodiment.

Figure 25A:
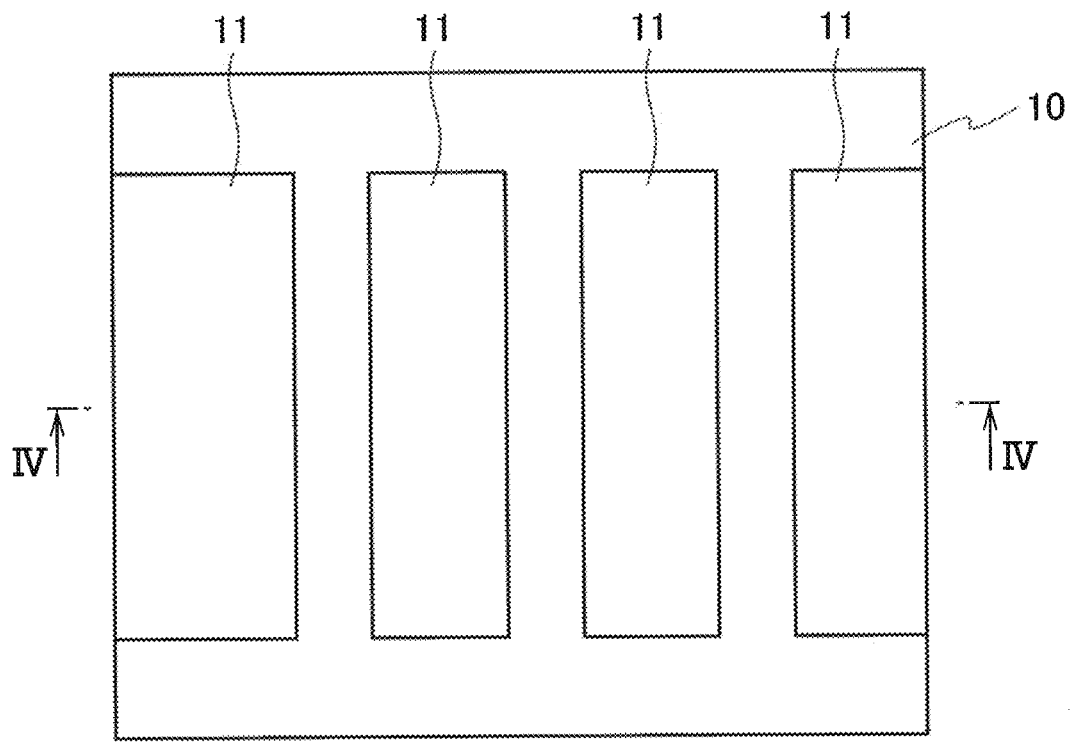
FIG. 25A is a schematic plane configuration diagram showing a state where a transparent electrode layer is pattern-formed on a substrate, in a process of the fabrication method of the organic thin film photovoltaic device module according to the embodiment.
Figure 25B:
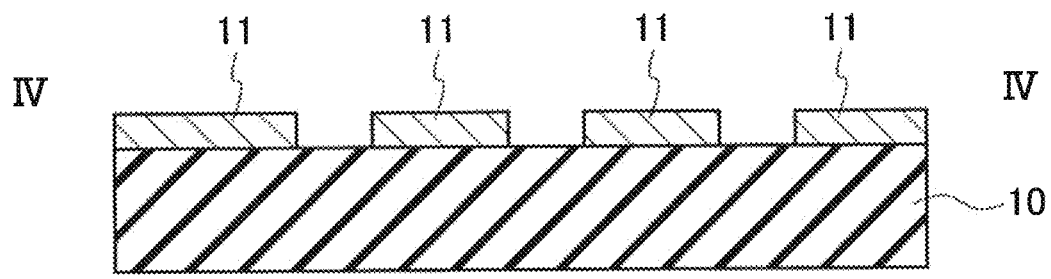
FIG. 25B is a schematic cross-sectional structure diagram taken in the line IV-IV of FIG. 25A.

FIG. 25A shows a schematic plane configuration of a state where the transparent electrode layer 11 is pattern-formed on the substrate 10, in a process of the fabrication method of the organic thin film photovoltaic device module 100 according to the embodiment, and FIG. 25B shows a schematic cross-sectional structure taken in the line IV-IV of FIG. 25A.

Figure 26A:
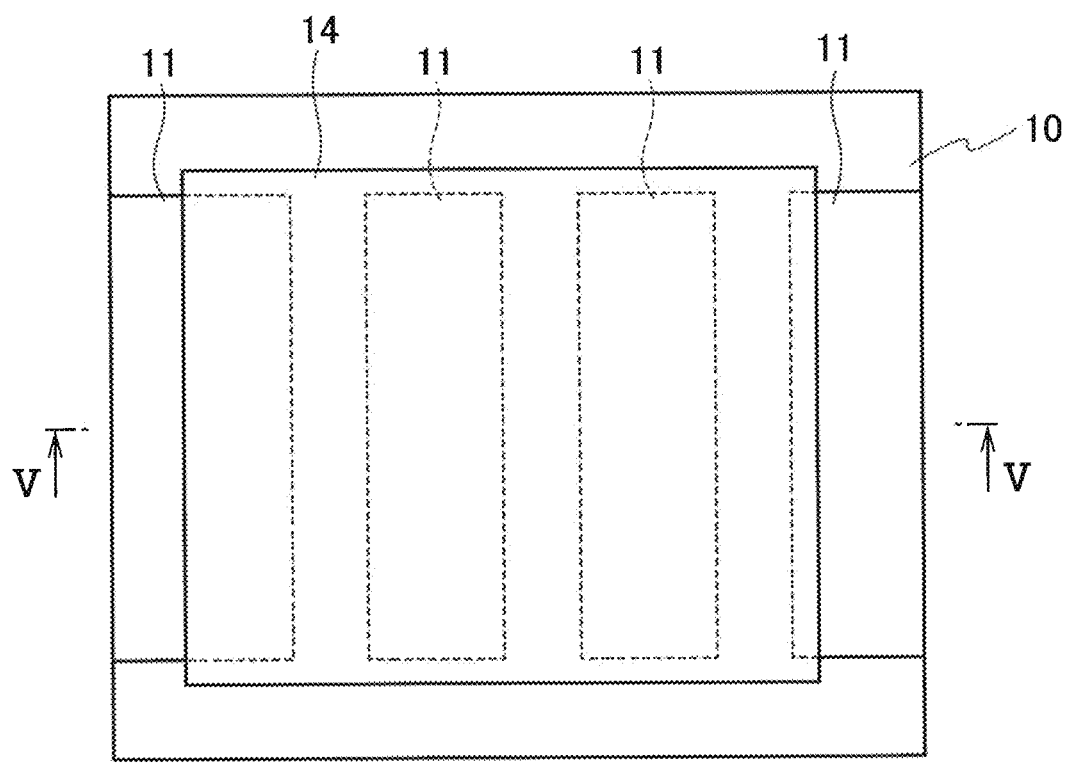
FIG. 26A is a schematic plane configuration diagram showing a state where an organic layer is pattern-formed on the transparent electrode layer, in a process of the fabrication method of the organic thin film photovoltaic device module according to the embodiment.
Figure 26B:
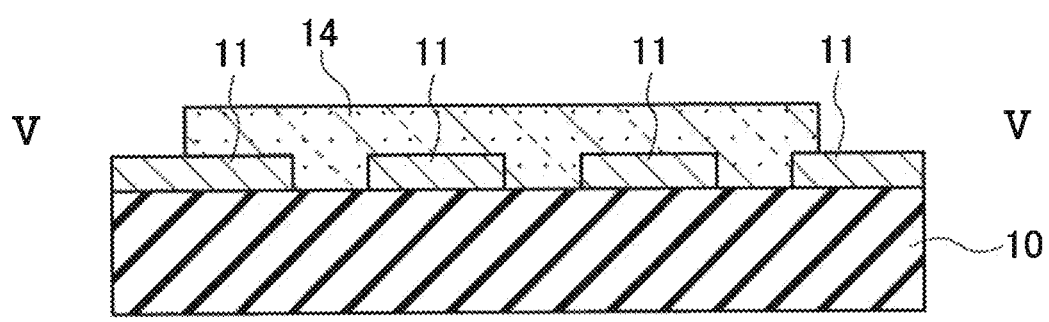
FIG. 26B is a schematic cross-sectional structure diagram taken in the line V-V of FIG. 26A.

FIG. 26A shows a schematic plane configuration of a state where the organic layer 14 is pattern-formed on the transparent electrode layer 11, in a process of the fabrication method of the organic thin film photovoltaic device module 100 according to the embodiment, and FIG. 26B shows a schematic cross-sectional structure taken in the line V-V of FIG. 26A.

Figure 27A:
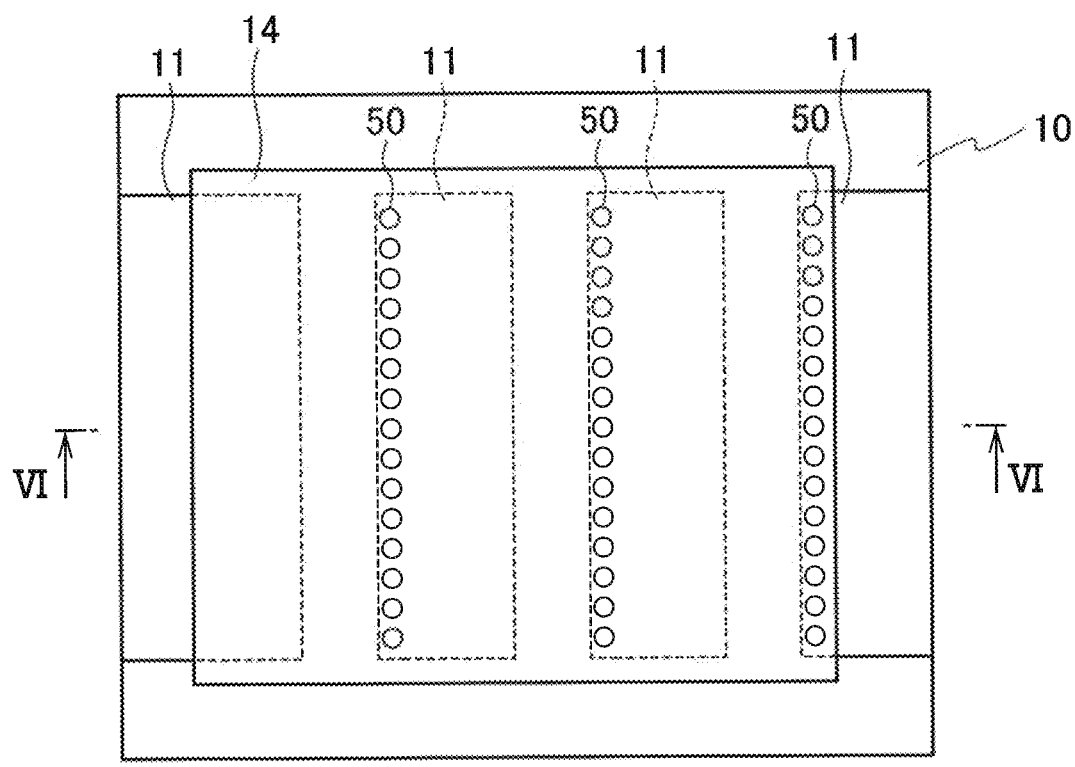
FIG. 27A is a schematic plane configuration diagram showing a state where a contact hole which reaches to the transparent electrode layer is pattern-formed in the organic layer, in a process of the fabrication method of the organic thin film photovoltaic device module according to the embodiment.
Figure 27B:
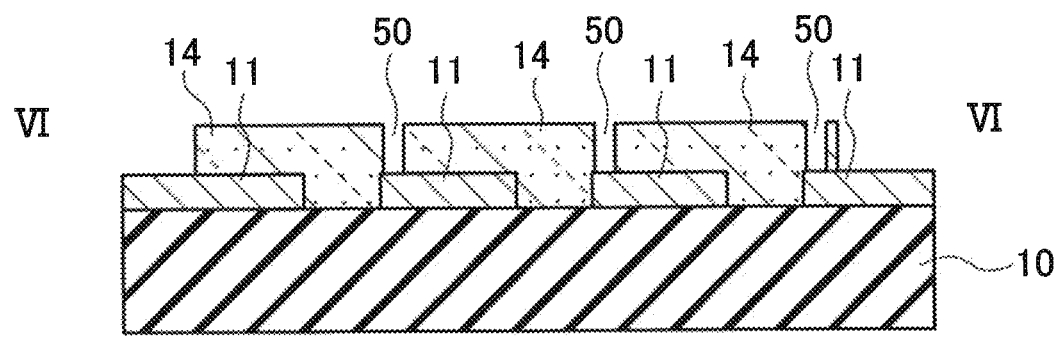
FIG. 27B is a schematic cross-sectional structure diagram taken in the line VI-VI of FIG. 27A.

FIG. 27A shows a schematic plane configuration of a state where the dot-shaped contact holes 50 which reach to the transparent electrode layer 11 is pattern-formed in the organic layer 14, in a process of the fabrication method of the organic thin film photovoltaic device module 100 according to the embodiment, and FIG. 27B shows a schematic cross-sectional structure taken in the line VI-VI of FIG. 27A.

Figure 28A:
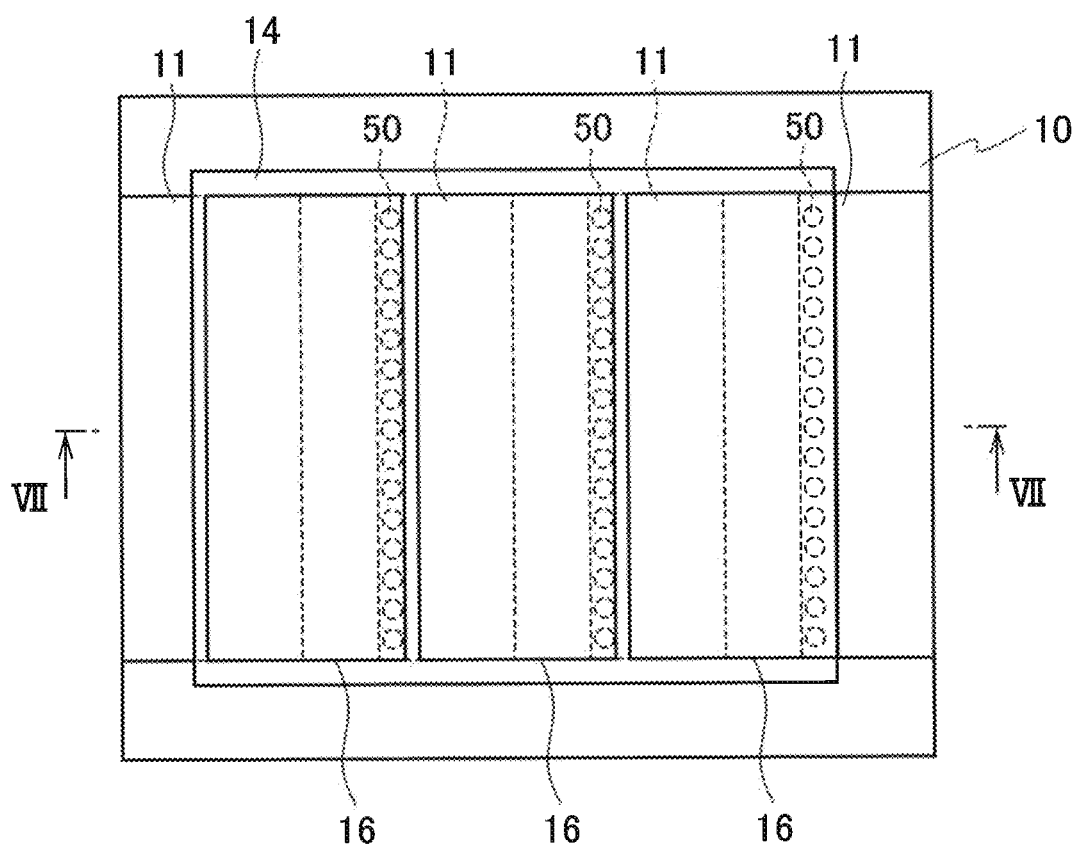
FIG. 28A is a schematic plane configuration diagram showing a state where a metal electrode layer is pattern-formed on the organic layer, in a process of the fabrication method of the organic thin film photovoltaic device module according to the embodiment.
Figure 28B:
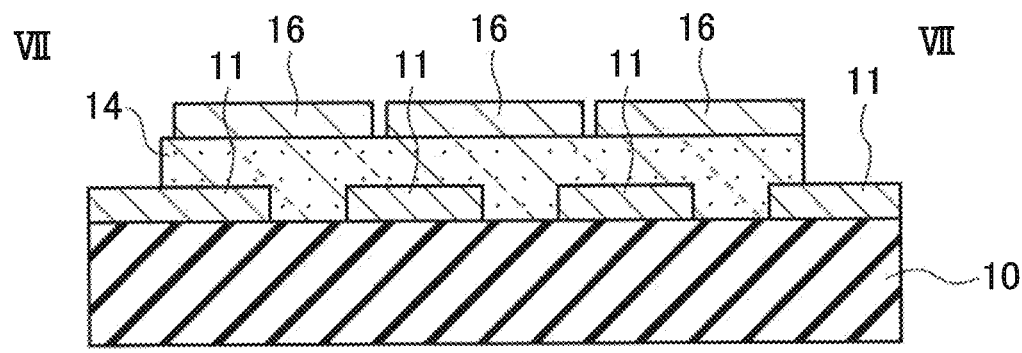
FIG. 28B is a schematic cross-sectional structure diagram taken in the line VII-VII of FIG. 28A.

FIG. 28A shows a schematic plane configuration of a state where the metal electrode layer 16 is pattern-formed on the organic layer 14 and on the transparent electrode layer 11 in the dot-shaped contact hole 50, in a process of the fabrication method of the organic thin film photovoltaic device module 100 according to the embodiment. FIG. 28B shows a schematic cross-sectional structure taken in the line VII-VII of FIG. 28A. FIG. 28B expresses a schematic cross-sectional structure at a portion without the dot-shaped contact hole 50.

Figure 29A:
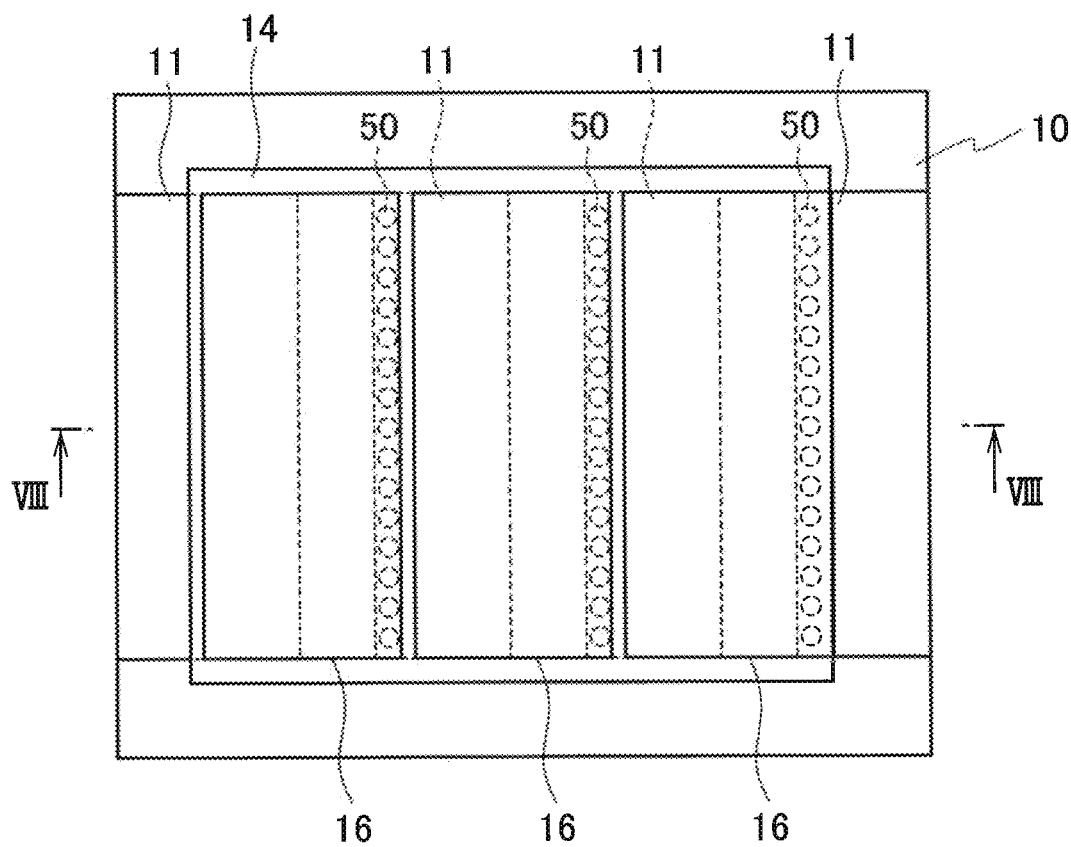
FIG. 29A is a schematic plane configuration diagram showing a state where a metal electrode layer is pattern-formed on the organic layer and on the transparent electrode layer in the contact hole, in a process of the fabrication method of the organic thin film photovoltaic device module according to the embodiment.
Figure 29B:
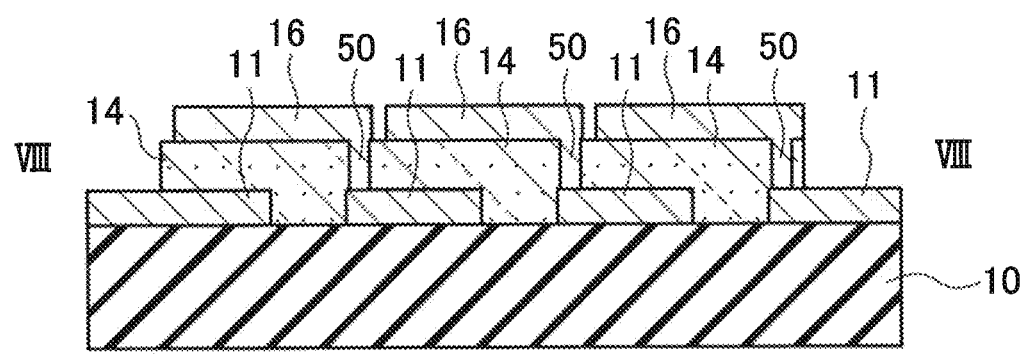
FIG. 29B is a schematic cross-sectional structure diagram taken in the line VIII-VIII of FIG. 29A.

Similarly, FIG. 29A shows a schematic plane configuration of a state where the metal electrode layer 16 is pattern-formed on the organic layer 14 and on the transparent electrode layer in the dot-shaped contact hole 50, in a process of the fabrication method of the organic thin film photovoltaic device module 100 according to the embodiment. FIG. 29B shows a schematic cross-sectional structure taken in the line VIII-VIII of FIG. 29A. FIG. 28B expresses a schematic cross-sectional structure at a portion with the dot-shaped contact holes 50.

Figure 30A:
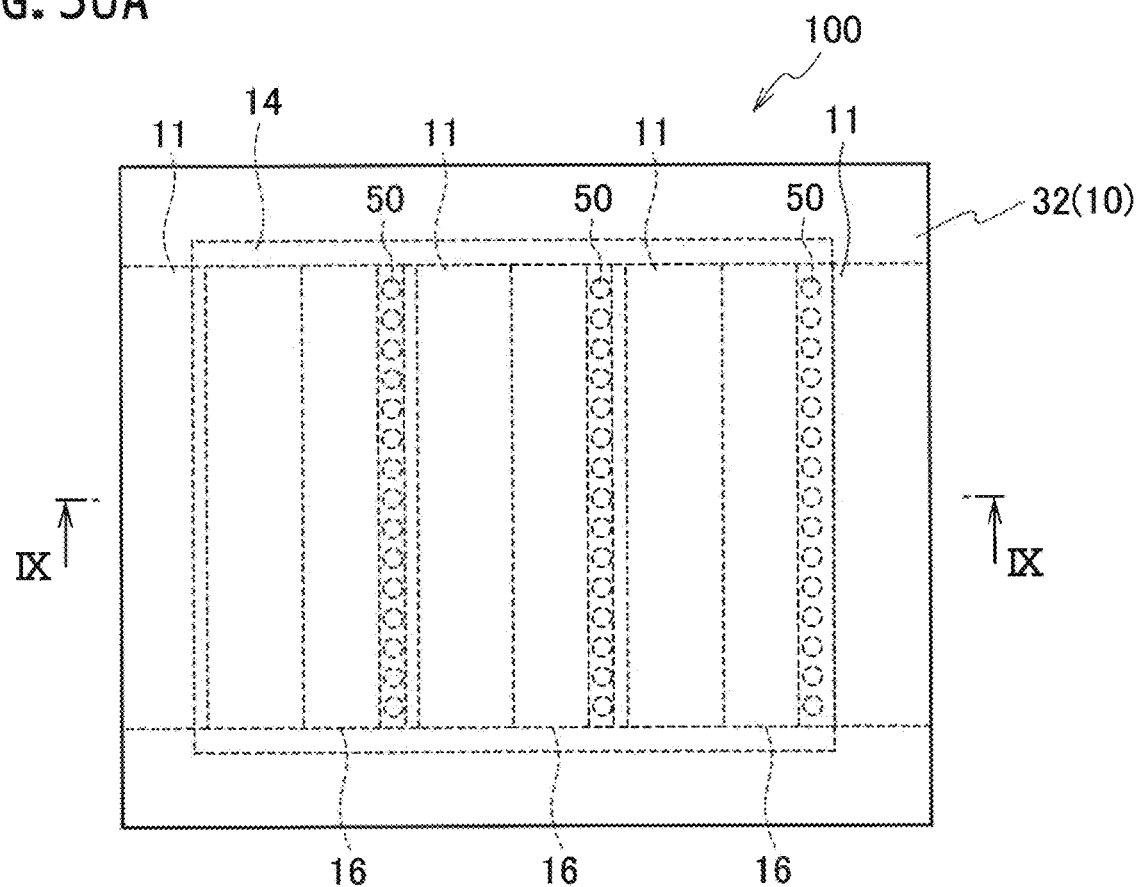
FIG. 30A is a schematic plane configuration diagram showing a state where a passivation layer is formed on the metal electrode layer, in a process of the fabrication method of the organic thin film photovoltaic device module according to the embodiment.
Figure 30B:
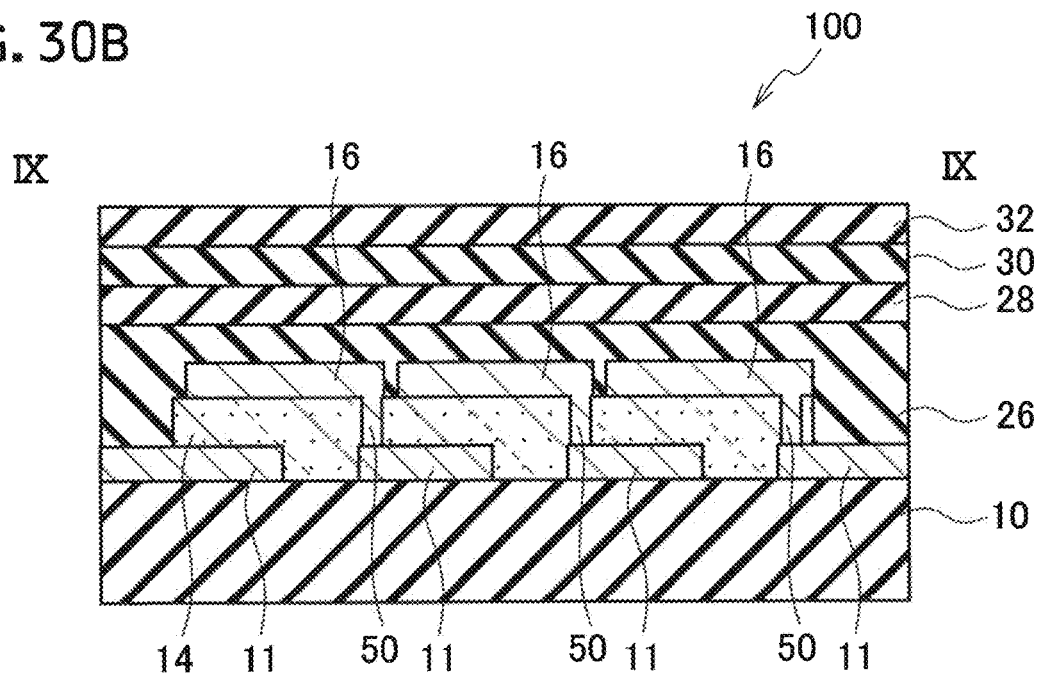
FIG. 30B is a schematic cross-sectional structure diagram taken in the line IX-IX of FIG. 30A.

FIG. 30A shows a schematic plane configuration of a state where the passivation layers 26, 25, 30, 32 are formed on the metal electrode layer 16, in a process of the fabrication method of the organic thin film photovoltaic device module 100 according to the embodiment. FIG. 30B shows a schematic cross-sectional structure taken in the IX-IX of FIG. 30A.

With reference to FIGS. 25-30, there will now be explained the fabrication method of the organic thin film photovoltaic device according to the embodiment, in which a plurality (three pieces, as an example in the figures) of the organic thin film photovoltaic device cells is arranged in series.

(a) Firstly, a glass substrate (of which the size is, for example, 50 mm in length×50 mm in width×0.7 mm in thickness) washed by pure water, acetone and ethanol is inserted into an Inductively Coupled Plasma (ICP) etcher, and adherents on the surface of the glass substrate are removed by $O_2$ plasma (Glass Substrate Surface Treatment). In order to efficiently guide the light to the organic layer, an antireflection process may be performed to the glass surface of the substrate 10 formed of a glass substrate. An alkali-free glass substrate with ITO may be used as the glass substrate, for example.

(b) Next, as shown in FIGS. 25A and 25B, the optically transmissive electrode layer 11 composed of, for example, ITO is pattern-formed on the glass substrate 10. Specifically, the TCO is patterned by wet etching, such as aqua regia etching, using a positive resist, for example. The patterning of the transparent electrode layer 11 requires five processes, e.g., approximately 120 minutes. As a consequence, a plurality of the transparent electrode layers 11 are formed in a stripe pattern so as to sandwich a trench region.

(c) Next, as shown in FIGS. 26A and 26B, the organic layer 14 (the hole transport layer 12 and the bulk heterojunction organic active layer 14A) is formed on each transparent electrode layer 11. The process of applying and forming of the organic layer 14 requires two processes, e.g., approximately 60 minutes. The process of applying and forming of the organic layer 14 includes a film formation by a spin coat method, and a patterning process by high-density plasma etching, for example.

(c-1) Spin coating technology, spray technology, screen printing technology, etc. can be applied to the formation of the hole transport layer 12. In this case, in the process for forming the hole transport layer 12, the film formation is performed, for example, by spin coating of PEDOT:PSS, and annealing is applied thereto for approximately 10 minutes at 120 degrees Celsius (C) for the purpose of water removal. Oxygen plasma etching technology, laser patterning technology, etc. can be applied to the formation of the trench region.

(c-2) Next, the bulk heterojunction organic active layer 14A is formed on each hole transport layer 12. In the formation process of the bulk heterojunction organic active layer 14A, film formation is performed with spin coating of P3HT and PCBM, for example.

(d) Next, as shown in FIGS. 27A 27B, a plurality of the dot-shaped contact holes 50 are formed so as to pass through up to the transparent electrode layer 11 in a perpendicular-to-plane direction with respect to the organic layer 14. An etching technology by high-density (oxygen) plasma is used for forming of the dot-shaped contact hole 50 with respect to the organic layer 14 (12, 14A) required in order to be contacted with the transparent electrode layer 11 (TCO), for example. Moreover, laser light having approximately 5 μm in diameter (of which the wavelength is 532 nm, for example) may be used therefor. Consequently, the dot-shaped contact hole 50 is formed in the joined portion for connecting the adjacent organic thin film photovoltaic device cells to each other in series.

(e) Next, as shown in FIGS. 28A, 28B, and FIGS. 29A and 29B, the second electrode layer (cathode electrode layer) 16 is pattern-formed on the organic layer 14 and on the transparent electrode layer 11 via the dot-shaped contact hole 50. The cathode electrode layer 16 is formed by depositing a metal layer (e.g., Al, W, Mo, Mn, Mg) by vacuum thermal vapor deposition, for example. Screen printing technology instead of the vacuum thermal vapor deposition may be applied to the formation of the cathode electrode layer 16. The formation process of the cathode electrode layer 16 requires one process, e.g., approximately 2 minutes.

(f) Next, although illustration is omitted, after performing an etching process of the unnecessary organic layer 14, an oxide film (passive state film) may be formed on a surface of the cathode electrode layer 16. The passive state film can be formed by applying oxygen plasma treatment to the second electrode layer 16. The passive state film can be formed using a high-density plasma etching apparatus, for example. It is also possible to perform an etching process of the organic layer 14 at the same time when the passive state film is formed by performing the oxygen plasma treatment of the second electrode layer 16.

(g) Next, as shown in FIGS. 30A and 30B, the passivation layer 26 is formed on the entire surface of the device. In this case, the passivation layer 26 may be formed of a silicon nitride film etc. with the CVD. The thickness of the silicon nitride film is approximately 0.5 μm to approximately 1.5 μm, for example. Durability can be further improved by sealing with the SiN film formed by using CVD to reduce degradation due to moisture or oxygen in atmospheric air.

(h) Next, as shown in FIGS. 30A and 30B, the colored barrier layer 28 is formed on the passivation layer 26. In order to eliminate defects, e.g. a spot etc. of the passivation layer 26 formed with the SiN film, and to smooth the back surface of the module, the UV curing resin material is coated with a spin coat method etc., then is cured by the UV irradiation. Coloring arbitrary to the module is enabled in the thin-layered element structure by using the protection film to which a coloring agent is added for the colored barrier layer 28.

(i) Next, as shown in FIGS. 30A and 30B, the back sheet passivation layer 30 is formed on the colored barrier layer 28. The back sheet passivation layer 30 may be formed of a silicon nitride film etc. with the CVD. The thickness of the silicon nitride film is approximately 0.5 μm to approximately 1.5 μm, for example. Durability can be further improved by sealing with the SiN film formed by using CVD to reduce degradation due to moisture or oxygen in atmospheric air. The cell sealing with the multi-layered protection film requires four processes, e.g., approximately 120 minutes.

(j) Next, although illustration is omitted, a bonding junction between an anode A electrode and a cathode K electrode of the organic thin film photovoltaic device module connected in series is formed. Carbon paste, Ag paste, etc. are used for the bonding junction, for example. The terminal electrode can be formed including a gold wire etc., for example.

(k) Finally, as shown in FIGS. 30A and 30B, it is protected with a UV curing resin from an intrusion of moisture, oxygen, etc.

According to the above-mentioned processes, the plurality (three pieces in the example in the figures) of the organic thin film photovoltaic device modules 100 according to the embodiment arranged in series can be completed.

(Fabrication Method of ITO Substrate)

Figure 31A:
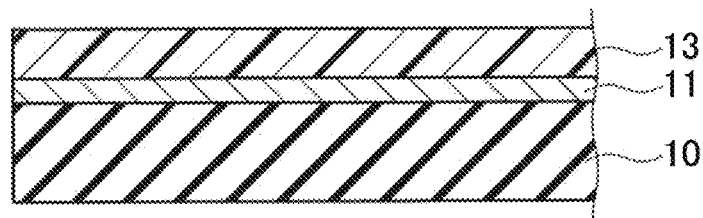
FIG. 31A is an application and sintering process diagram of a resist layer, in the fabrication method of an ITO substrate in which the transparent electrode layer is pattern-formed on the substrate, in the fabrication method of the organic thin film photovoltaic device module according to the embodiment.

FIG. 31A shows an application and sintering process of a positive resist layer 13, in the fabrication method of an ITO substrate in which the transparent electrode layer 11 is pattern-formed on the substrate 10, in the fabrication method of the organic thin film photovoltaic device module 100 according to the embodiment. Moreover, FIG. 31B shows an exposure process of the positive resist layer 13, FIG. 31C shows a developing process of a positive resist layer 13, FIG. 31D shows an aqua regia etching process of the transparent electrode layer 11, and FIG. 31E shows resist removing and substrate washing process of the positive resist layer 13.

(a) Firstly, as shown in FIG. 31A, the positive resist layer 13 is coated on an ITO substrate, and then is sintered.

Figure 31B:
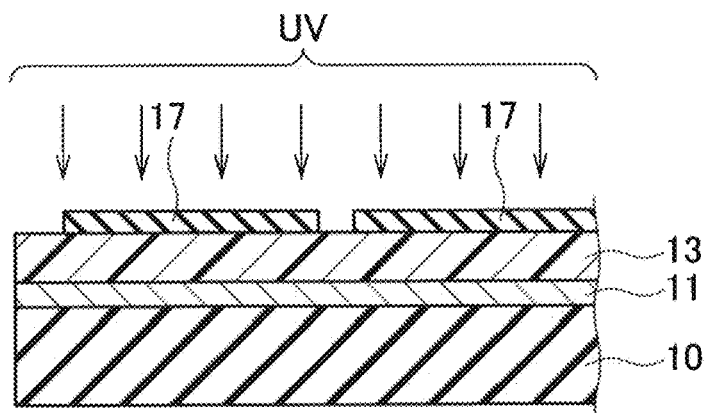
FIG. 31B is an exposure process diagram of the resist layer, in the fabrication method of an ITO substrate in which the transparent electrode layer is pattern-formed on the substrate, in the fabrication method of the organic thin film photovoltaic device module according to the embodiment.

(b) Next, as shown in FIG. 31B, a positive mask 17 is pattern-formed on the positive resist layer 13, and then is subjected to UV exposure.

Figure 31C:
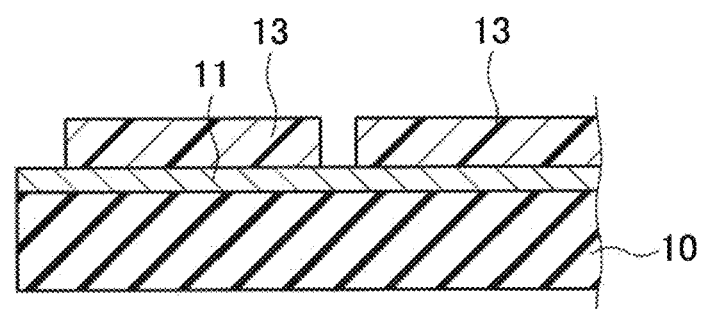
FIG. 31C is a developing process diagram of the resist layer, in the fabrication method of an ITO substrate in which the transparent electrode layer is pattern-formed on the substrate, in the fabrication method of the organic thin film photovoltaic device module according to the embodiment.
Figure 31D:
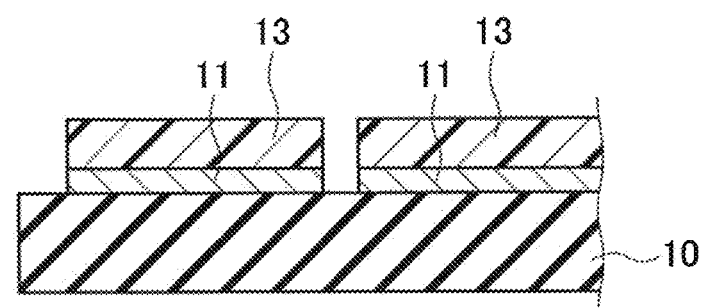
FIG. 31D is an aqua regia etching process diagram of the transparent electrode layer, in the fabrication method of an ITO substrate in which the transparent electrode layer is pattern-formed on the substrate, in the fabrication method of the organic thin film photovoltaic device module according to the embodiment.
Figure 31E:
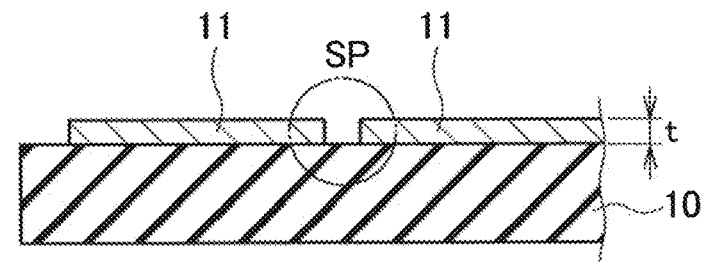
FIG. 31E is a resist removing and substrate washing process diagram, in the fabrication method of an ITO substrate in which the transparent electrode layer is pattern-formed on the substrate, in the fabrication method of the organic thin film photovoltaic device module according to the embodiment.

(c) Next, as shown in FIG. 31C, the positive resist layer 13 is subjected to a development processing.

(d) Next, as shown in FIG. 31D, the transparent electrode layer 11 is subjected to aqua regia etching.

(e) Next, as shown in FIG. 31E, the positive resist layer 13 is removed, and then the substrate is subjected to a washing process. Consequently, the ITO substrate in which the transparent electrode layer 11 is pattern-formed on the glass substrate 10 is completed. The thickness of the transparent electrode layer 11 is approximately 0.15 μm, for example.

Figures 32A, 32B:
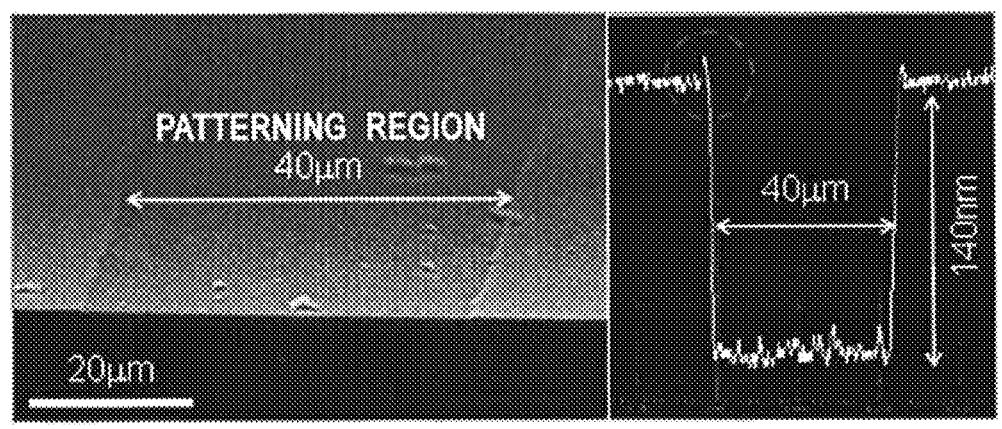
FIG. 32A shows an example of an SEM observation in an aspect of an etching cross section of a patterning region SP of the transparent electrode layer, in FIG. 31E.
FIG. 32B shows an example of a cross-sectional profile in an aspect of an etching cross section of a patterning region SP of the transparent electrode layer, in FIG. 31E.

FIG. 32A shows an example of an SEM observation of an aspect of an etching cross section of the patterning region SP in the transparent electrode layer 11, in FIG. 31E, and FIG. 32B shows an example of a cross-sectional profile thereof. As shown in FIG. 32A, the width of the patterning region SP is approximately 40 μm, and the depth thereof is approximately 140 nm.

(Spin Coat Method)

FIG. 32A is a schematic showing a spin coat method at the time of forming the hole transport layer 12 and the bulk heterojunction organic active layer 14A, in the fabrication method of the organic thin film photovoltaic device module 100 according to the embodiment. FIG. 32B shows a schematic bird's-eye view configuration of an example of the formed hole transport layer 12 and the formed bulk heterojunction organic active layer 14A.

For example, if a relative small-area element is created, a spin coat method as shown in FIG. 32A can be applied, in the organic thin film photovoltaic device module 100 according to the embodiment.

More specifically, a spin coater including a high-speed rotating spindle 62 connected to driving sources, e.g. a motor, and a table fixed to the spindle 62, wherein the substrate 10 is mounted on the table 63 is used therefor, as shown in FIG. 32A.

Then, the driving source, e.g. a motor, is worked after the substrate 10 is mounted on the table 63, and then the table 63 is rotated at a high speed, e.g., 2000-4000 rpm, in arrows A, B direction. Subsequently, a droplet 64 of a solution for forming the hole transport layer 12 and the bulk heterojunction organic active layer 14A is dropped thereon using a syringe 65. Thereby, the hole transport layer 12 and the bulk heterojunction organic active layer 14A having uniform thickness (refer to FIG. 32B) can be formed with the droplet 64 on the substrate 10 in accordance with centrifugal force.

(Fabrication Method of Dot-Shaped Contact Hole)

Figure 34A:
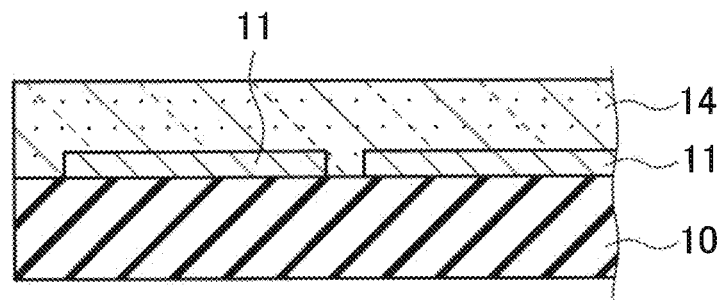
FIG. 34A is a process chart for forming the organic layer on the transparent electrode layer with a spin coat method, in the fabrication method of the organic thin film photovoltaic device module according to the embodiment.
Figure 34B:
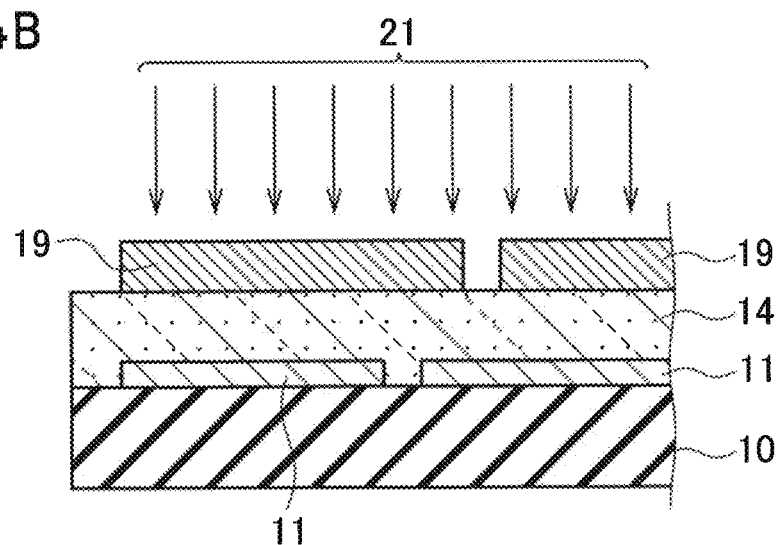
FIG. 34B is a patterning process diagram with high-density (oxygen) plasma after pattern formation of a metal mask, in the fabrication method of the organic thin film photovoltaic device module according to the embodiment.
Figure 34C:
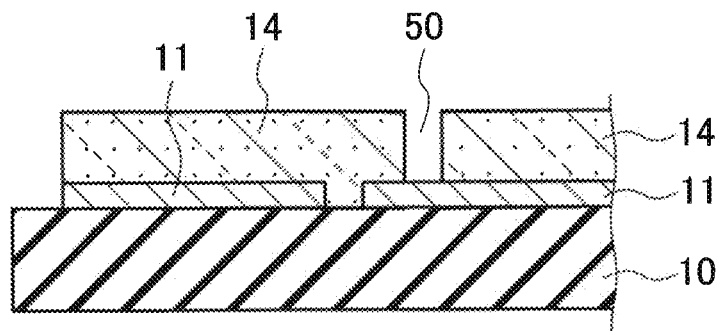
FIG. 34C is a removing process diagram of the metal mask, in the fabrication method of the organic thin film photovoltaic device module according to the embodiment.

FIGS. 34A to 34C show a fabrication method of the dot-shaped contact hole, in the fabrication method of the organic thin film photovoltaic device module 100 according to the embodiment. More specifically, FIG. 34A shows a process of forming the organic layer 14 on the transparent electrode layer 11 with a spin coat method; FIG. 34B shows a process of patterning the organic layer 14 and the transparent electrode layer 11 with high-density (oxygen) plasma 21, after pattern formation of a metal mask 19 to be used for forming the dot-shaped contact hole; and FIG. 34C shows a removing process of the metal mask 19.

Figure 33A:
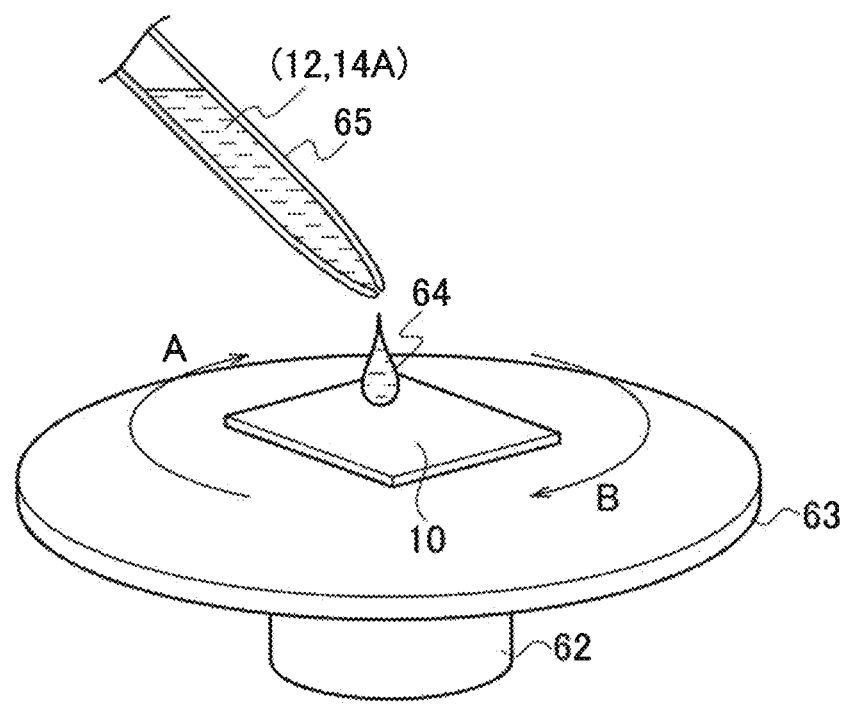
FIG. 33A is a schematic diagram showing a spin coat method at the time of forming the hole transport layer and the bulk heterojunction organic active layer, in the fabrication method of the organic thin film photovoltaic device module according to the embodiment.

(A) Firstly, as shown in FIG. 33A, a process of applying and forming of the organic layer 14 is performed on the ITO substrate with a spin coat method. The process of applying and forming thereof requires approximately 80 seconds.

Figure 33B:
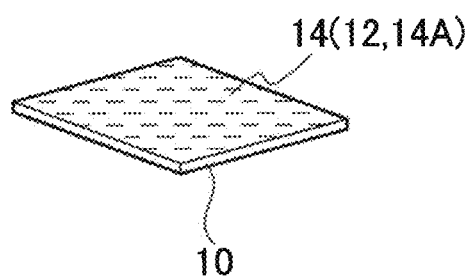
FIG. 33B is a schematic bird's-eye view configuration diagram showing an example of the hole transport layer and the bulk heterojunction organic active layer formed in the fabrication method of the organic thin film photovoltaic device module according to the embodiment.

(b) Next, as shown in FIG. 33B, the organic layer 14 and the transparent electrode layer 11 are patterned thereon with the high-density (oxygen) plasma 21 after the metal mask 19 for forming the dot-shaped contact hole is patterned-formed on the organic layer 14. The patterning process with the oxygen plasma requires approximately 50 minutes.

(c) Next, as shown in FIG. 33C, the metal mask is removed therefrom. As a consequence, the dot-shaped contact hole 50 is formed in the organic layer 14 and the transparent electrode layer 11.

(Ink-Jet Process)

Figure 35A:
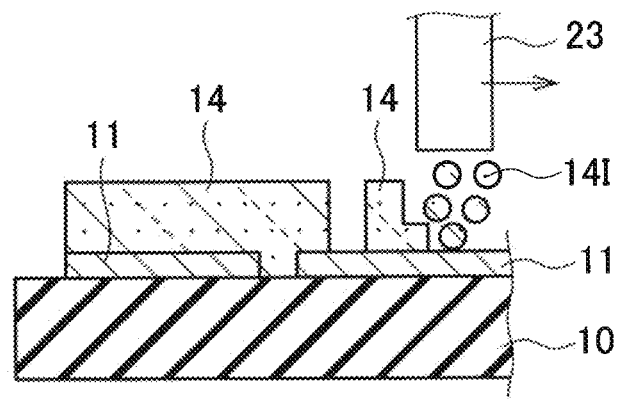
FIG. 35A is an explanatory diagram of an aspect that an organic material ink is coated with an ink-jet process from an ink head, in the fabrication method of the organic thin film photovoltaic device module according to the embodiment.

The dot-shaped contact hole 50 can also be formed with an ink-jet process, in the fabrication method of an organic thin film photovoltaic device module 100 according to the embodiment. More specifically, in the fabrication method of an organic thin film photovoltaic device module 100 according to the embodiment, FIG. 35A shows an aspect that the organic material ink 141 is applied onto the ITO substrate from an ink head 23 with an ink-jet process.

Figure 35B:
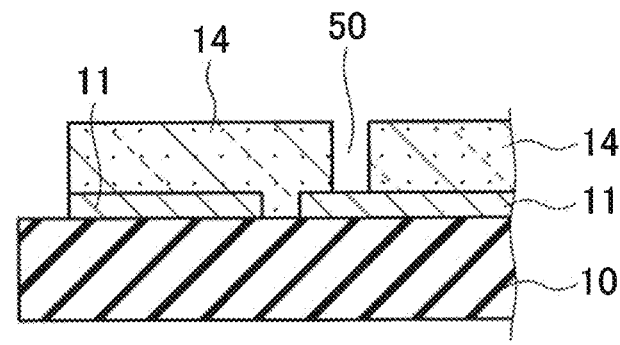
FIG. 35B is a process chart for forming the organic layer on the transparent electrode layer with an ink-jet process, in the fabrication method of the organic thin film photovoltaic device module according to the embodiment.

Moreover, FIG. 35B shows a process of forming the dot-shaped contact hole 50 by separately coating and forming the organic layer 14 with the ink-jet process on the ITO substrate.

(Producing Steps of Organic Thin Film Photovoltaic Device)

Figure 36:
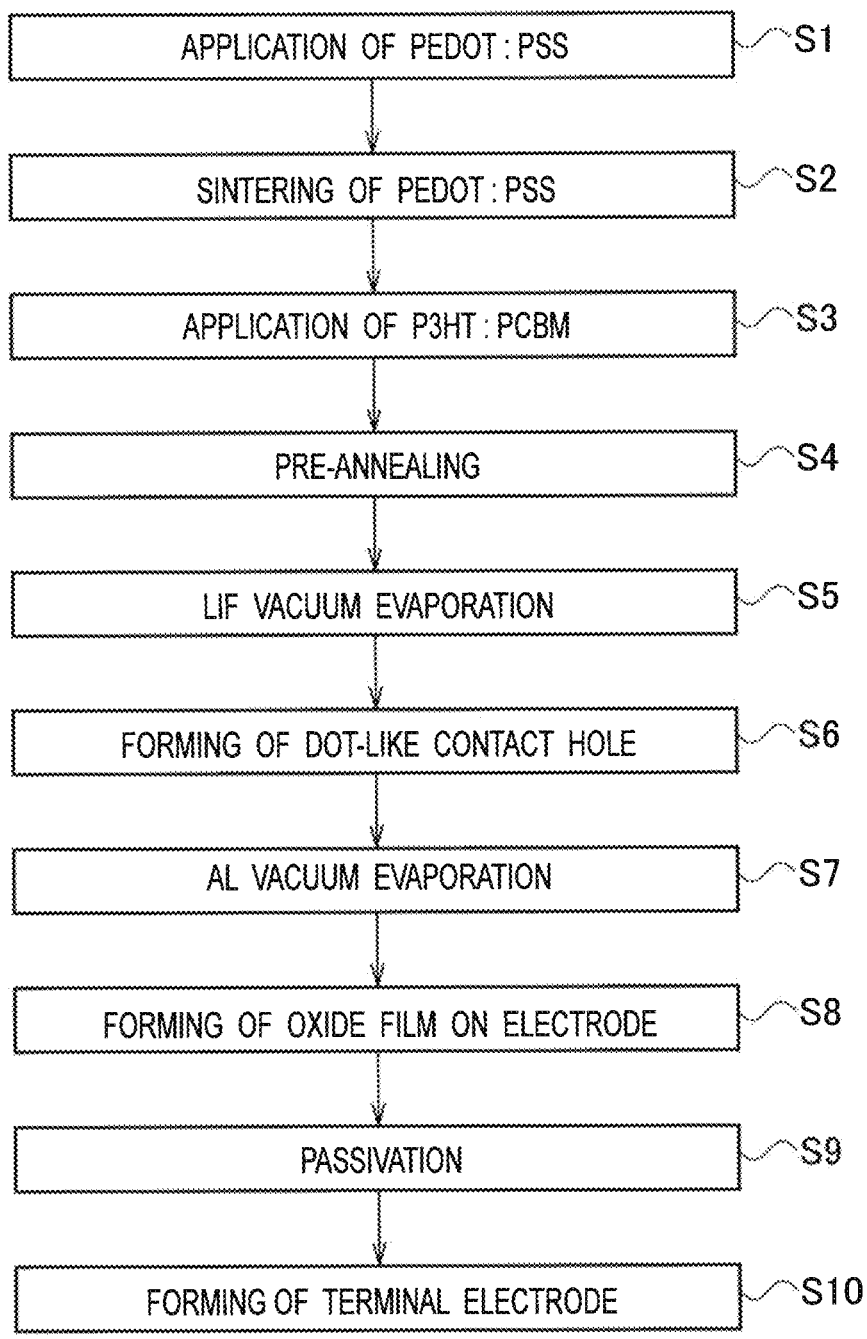
FIG. 36 is a flow chart showing producing steps of the organic thin film photovoltaic device module according to the embodiment.

In accordance with the flow chart shown in FIG. 36, there will now be explained producing steps of the organic thin film photovoltaic device module 100 according to the embodiment.

(a) In Step S1, PEDOT:PSS is coated on the ITO substrate 10. For example, PEDOT:PSS aqueous solution is filtered with a 0.45-μm PTFE membrane filter to remove undissolved matters and impurities, and then the PEDOT:PSS aqueous solution is coated on the ITO substrate 10 with spin coating (for example, 4000 rpm for 30 sec).

(b) In Step S2, the PEDOT:PSS is sintered. More specifically, heat-treatment is performed at 120 degrees C. for 10 minutes for the purpose of water removal, after the film formation. In addition, it is effective to cover a petri dish previously heated by a hot plate so that the heat may be transferred to whole of the substrate 10. The hole transport layer 12 is formed on the transparent electrode layer 11 on the ITO substrate 10 by the above-mentioned processes.

(c) In Step S3, P3HT:PCBM is coated on the substrate 10. Specifically, P3HT 16 mg and PCBM 16 mg are dissolved in dichlorobenzene (o-dichlorobenzene), for example. The solution is subjected to ultrasonic treatment for 1 minute at 50 degrees C., after agitating at 50 degrees C. under nitrogen atmosphere for a night. Spin coating of the solution is performed on the ITO substrate 10 subjected to washing treatment in a glove box replaced with nitrogen (<1 ppm $O_2$, $H_2O$). A rotational frequency of the spin coating is 2000 rpm per 1 sec after 550 rpm per 60 sec.

(d) In Step S4, pre-annealing is performed. More specifically, heating processing is performed for 10 minutes at 120 degrees C. after the coating of Step S3. In addition, it is effective to cover a petri dish previously heated by a hot plate so that the heat may be transferred to whole of the substrate 10. By the above-mentioned processes, the bulk heterojunction organic active layer 14A is formed on the hole transport layer 12, and thereby the organic layer 14 (12+14A) is formed.

(e) In Step S5, LiF vacuum evaporation is performed. Specifically, as for LiF (purity: 99.98%), vacuum thermal evaporation is performed with the vacuum degree: $1.1 \times 10^{-6}$ torr and the vacuum evaporation rate: 0.1 angstrom/sec. The LiF used for an electronic injection layer with respect to the bulk heterojunction organic active layer 14A.

(f) In Step S6, the dot-shaped contact hole 50 is formed so as to pass through the organic layer 14 and reach up to the transparent electrode layer 11.

(g) In Step S7, Al vacuum evaporation is performed, and thereby the second electrode layer 16 is formed on the transparent electrode layer 11 and on the organic layer 14 in the dot-shaped contact hole 50. Specifically, as for Al (purity: 99.999%), vacuum thermal evaporation is performed with the vacuum degree: $1.1 \times 10^{-6}$ torr and the vacuum evaporation rate: more than 2 angstroms/sec.

(h) In Step S8, an oxide film is formed on the second electrode layer 16. Specifically, the surface of the second electrode layer 16 is oxidized with oxygen plasma by using a high-density plasma etching apparatus, thereby forming the oxide film (passive state film).

(i) In Step S9, passivation sealing is performed. Specifically, the passivation layer 26, the colored barrier layer 28, and the back sheet passivation layer 30 are formed to be laminated one after another on the whole device, and thereby passivation processing is performed.

(j) In Step S10, the terminal electrode is formed. Carbon paste, Ag paste, etc. are used for the bonding junction of the terminal electrode, for example.

(k) In Step S11, sealing is performed. Specifically, a peripheral portion thereof is protected by a resin layer 32, e.g. a UV curing resin, etc. from infiltration of moisture, oxygen, etc.

(Electronic Apparatus)

The embodiment provides the organic thin film photovoltaic device having satisfactory appearance without deteriorating appearance thereof and having the improved structure of the portion jointed in series. Accordingly, it becomes easy to mount mobile terminal equipment etc. in the electronic apparatus. It is more effective for first extraction terminal electrodes not to be conspicuous at the time of mounting the cell of the organic thin film photovoltaic device on a bezel (peripheral part of the display) and the back surface of the display panel since an external view is important for electronic devices represented by in particular smart phones, tablet-type devices, etc. The plurality of the dot-shaped contact holes with respect to the organic layer 14 (12, 14A) required in order to be contacted with the transparent electrode layer 11 (TCO) can be formed using high density (oxygen) plasma etching technology, or laser light having approximately 5 μm in diameter (of which the wavelength is 532 nm, for example). Since such a method is used, contact resistance can be reduced without impairing external appearance, and thereby forming satisfactory bonding.

As mentioned above, according to the embodiment, there can be provided: the organic thin film photovoltaic device module having satisfactory appearance without deteriorating appearance thereof and having the improved structure of the portion jointed in series; the fabrication method such an organic thin film photovoltaic device module; and the electronic apparatus.

Other Embodiments

As explained above, the embodiment has been described, as a disclosure including associated description and drawings to be construed as illustrative, not restrictive. This disclosure makes clear a variety of alternative embodiment, working examples, and operational techniques for those skilled in the art.

Such being the case, the embodiment described herein covers a variety of embodiments, whether described or not.

INDUSTRIAL APPLICABILITY

The organic thin film photovoltaic device module of the embodiment can be applied to wide fields, e.g. photovoltaic power generation panels, chargers for mobile terminals, etc.

What is claimed is:

1. An organic thin film photovoltaic device module, comprising:
    a supporting unit configured to transmit at least a part of a visible light;
    a first electrode layer formed on the supporting unit, the first electrode layer being configured to transmit at least the part of the visible light;
    a second electrode layer formed on the supporting unit so as to be separated from the first electrode layer, the second electrode layer configured to transmit at least the part of the visible light;
    an organic layer extending over the first electrode layer and the second electrode layer, the organic layer comprising a first opening formed such that a part of the second electrode layer is exposed, the organic layer configured to absorb at least the part of the visible light thereby generating electric power;
    a first conductive unit formed on a surface of the organic layer and extending to a surface of the second electrode layer via the first opening; and
    an insulation layer including a passivation layer, a colored barrier layer, a back sheet passivation layer, and a resin layer, wherein
    the passivation layer is formed on an entire surface of the device module and directly contacts the supporting unit, the first electrode layer, and the organic layer,
    the passivation layer, the colored barrier layer, the back sheet passivation layer, and the resin layer are formed to be laminated one after another on the entire surface of the device module,
    a surface of the organic layer at a side of the first conductive unit is planar except for portions in which dot-shaped contact holes are formed,
    an interval between the dot-shaped contact holes is an interval selected from the group consisting of a fixed interval of approximately 10 μm to approximately 100 μm and an unfixed interval of approximately 10 μm to approximately 100 μm, and
    the first conductive unit is formed such that at least a part of the surface of the organic layer is exposed.

2. The organic thin film photovoltaic device module according to claim 1, wherein the organic layer further comprises a plurality of openings including the first opening, the plurality of openings extending from a first end of the first conductive unit to a second end of the first conductive unit in a second direction, and the second direction is a direction orthogonal to a first direction that is a direction in which the first electrode layer and the second electrode layer are arranged, when viewed in a plan view, wherein
    the first conductive unit is formed so as to extend from the surface of the organic layer to the second electrode layer via the plurality of openings, and
    the organic layer has a length less than a length of the supporting unit in the first direction in the plan view.

3. The organic thin film photovoltaic device module according to claim 2, wherein the second electrode layer includes a first portion that is separate from the organic layer when viewed in the plan view, the first portion overlaps with the organic layer in the second direction, and
    the first electrode layer includes a first portion that is separate from the organic layer when viewed in the plan view and in the second direction.

* * * * *